(12) United States Patent
Manevitz et al.

(10) Patent No.: US 7,225,173 B2
(45) Date of Patent: May 29, 2007

(54) APPARATUS AND METHOD FOR EFFICIENT ADAPTATION OF FINITE ELEMENT MESHES FOR NUMERICAL SOLUTIONS OF PARTIAL DIFFERENTIAL EQUATIONS

(75) Inventors: Larry Manevitz, Haifa (IL); Akram Bitar, Kfar Peqii'n (IL); Dan Givoli, Haifa (IL)

(73) Assignee: Carmel - Haifa University Economic Corporation Ltd., Haifa (IL)

( * ) Notice: Subject to any disclaimer, the term of this patent is extended or adjusted under 35 U.S.C. 154(b) by 276 days.

(21) Appl. No.: 10/657,210

(22) Filed: Sep. 9, 2003

(65) Prior Publication Data

US 2004/0133616 A1   Jul. 8, 2004

Related U.S. Application Data

(60) Provisional application No. 60/409,531, filed on Sep. 9, 2002.

(51) Int. Cl.
*G06E 1/00*    (2006.01)
*G06E 3/00*    (2006.01)
*G06F 15/18*   (2006.01)
*G06G 7/00*    (2006.01)

(52) U.S. Cl. .............................. 706/21; 706/6; 706/12; 706/14; 706/15; 706/32

(58) Field of Classification Search ................ 706/6, 706/12, 14, 15, 21, 32; 708/443
See application file for complete search history.

(56) References Cited

OTHER PUBLICATIONS

Manevitz, Larry, Yousef, Malik; Finite-Element Mesh Generation Using Self-Organizing Neural Networks; Jul. 1997, Computer-Aided Civil & Infrastructure Engineering, vol. 12 Issue 4, p. 233.*
Automatic Finite-Element Mesh Generation Using Artificial Neural Networks-Part I: Prediction of Mesh Density; Sep. 1996; IEEE Transactions on Magnetics: vol. 32, No. 5.*
Hassoun, Mohamad H.; Fundamentals of Artificial Neural Networks, 1995 MIT Press.*
Lagaris et al., Artificial Neural Networks for Solving Ordinary and Partial Differential Equations, IEEE Transactions On Neural Networks, vol. 9, No. 5, Sep. 1998.*
Larry Manevitz, Finite-Element Mesh Generation Using Self-Organizing Neural Networks, Jul. 1997, Computer-Aided Civil & Infrastructure Engineering, Vo.l 32 No. 5, 233-250.*
R. Chedid et al, Automatic Finite-Element Mesh generation Using Artificial Neural Networks—Part 1: Prediction of Mesh Density, Sep. 1996, IEEE Transactions on Magnetics, vol. 32, No. 5, 5173-5178.*
Larry Manevitz, Finite-Element Mesh Adaption via Time Series Prediction Using Neural Networks, Dec. 2, 2001, The Sixth Online World Conference on Soft Computing in Industrial Applications, 769-782.*

* cited by examiner

*Primary Examiner*—Joseph P Hirl

(57) ABSTRACT

A device for calculating numerical solutions for partial differential equations in successive intervals using adaptive meshes, comprises: a neural network part for producing predictions of gradients at a following interval based on gradients available from previous intervals, and a mesh adaptation part, associated with the neural network part, configured for adapting a mesh over a domain of a respective partial differential equation using the predictions, such that the mesh adaptively refines itself about emerging regions of complexity as the partial differential equation progresses over the successive intervals. The neural network part succeeds in its predictions since its use herein is equivalent to using time series function fitting techniques.

19 Claims, 18 Drawing Sheets

Neural Network Time Series Forecasting of Finite-Element Mesh Adaptation

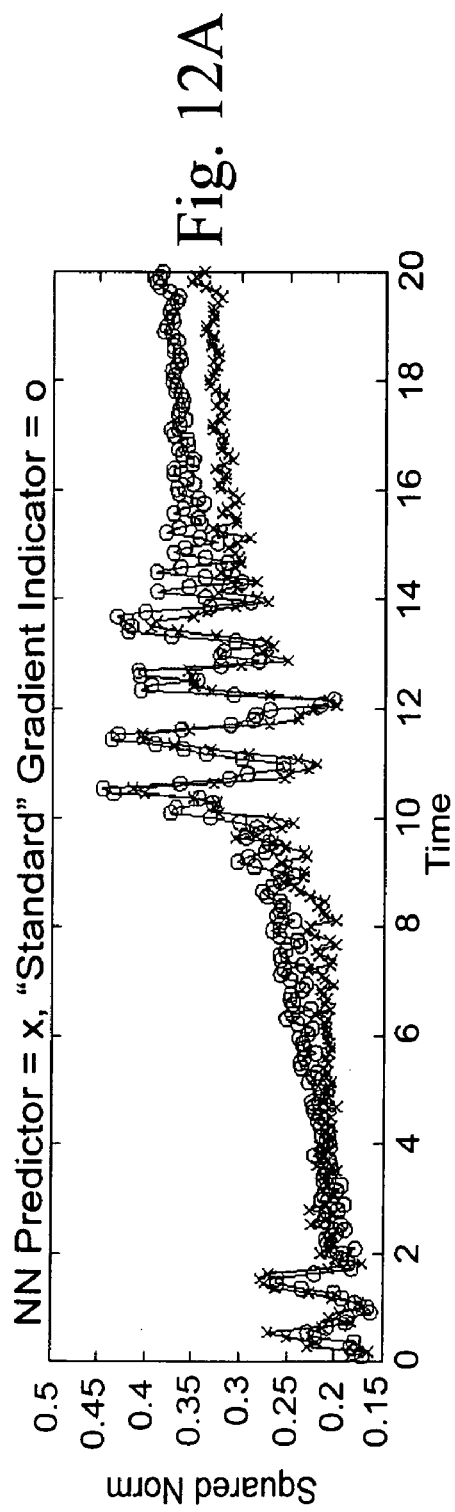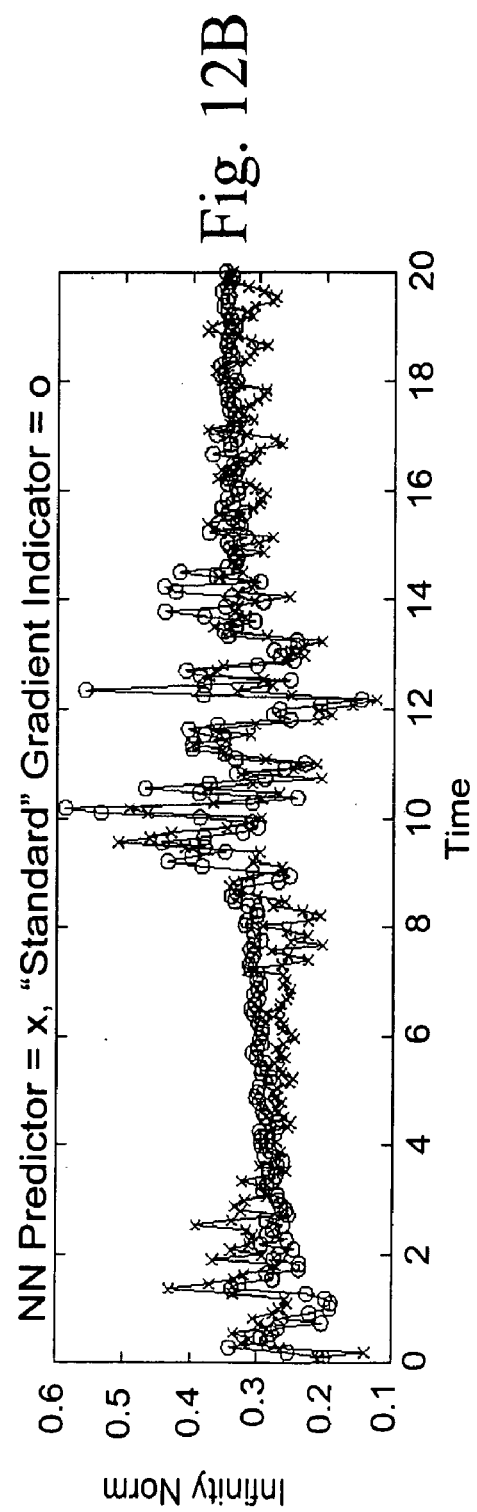

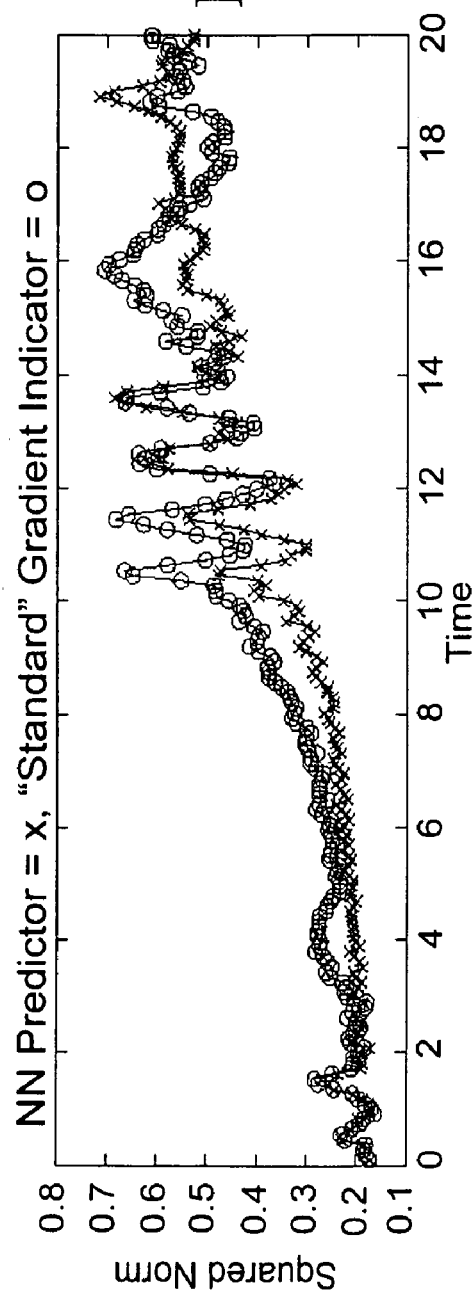
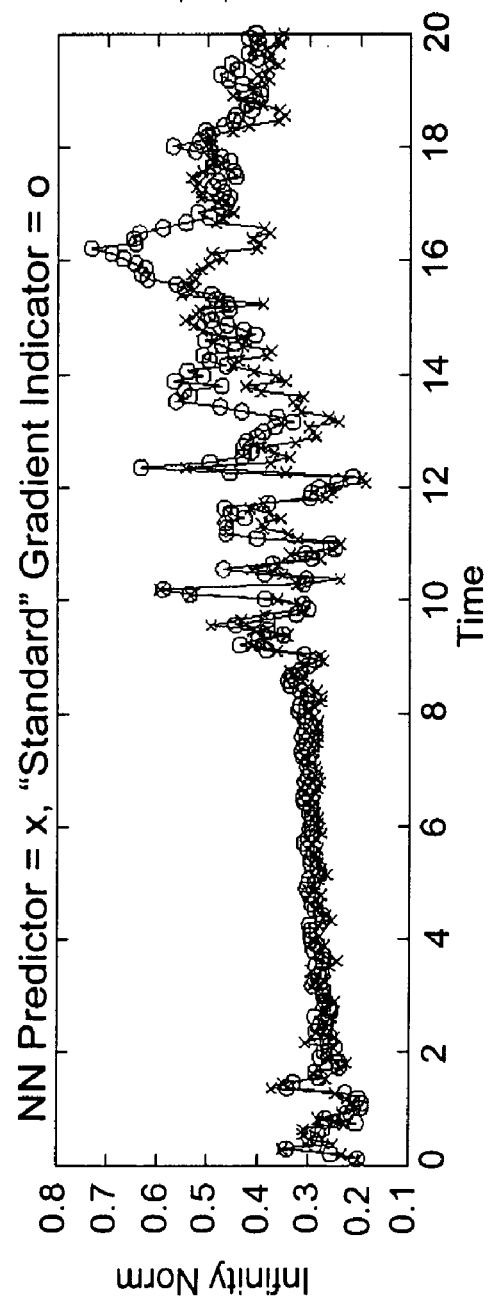
Fig. 13A
Fig. 13B

APPARATUS AND METHOD FOR EFFICIENT ADAPTATION OF FINITE ELEMENT MESHES FOR NUMERICAL SOLUTIONS OF PARTIAL DIFFERENTIAL EQUATIONS

RELATIONSHIP TO EXISTING APPLICATIONS

The present application claims priority from U.S. Provisional Patent Application No. 60/409,531 filed Sep. 9, 2002, the contents of which are hereby incorporated by reference.

FIELD AND BACKGROUND OF THE INVENTION

The present invention relates to apparatus and method for improved efficiency of adaptations of finite element meshes for numerical solutions of partial differential equations.

The finite-element method is the most effective of currently available numerical techniques for solving various problems arising from mathematical physics and engineering. In particular, it is the most widely used of numerical techniques for solving problems described by partial differential equations (PDEs).

Time-dependent PDEs arise when modeling numerous phenomena in science and engineering, and tend to be divided into two categories: hyperbolic and parabolic. The hyperbolic PDE is used for transient and harmonic wave propagation in acoustics and electromagnetics, and for transverse motions of membranes. The basic prototype of the hyperbolic PDE is the family of wave equations. The parabolic PDE is used for unsteady heat transfer in solids, flow in porous media and diffusion problems. The basic prototype parabolic PDE is the family of heat equations.

The concept behind the finite-element method is to reduce a continuous physical problem with infinitely many unknown field values to a finite number of unknowns by discretizing the solution region into elements. Then, the values of the field at any point can be approximated by interpolation functions within every element in terms of the field values at specified points called nodes. Nodes are located at the element vertices where adjacent elements are connected. The approximation of the solution at each element should be consistent with neighboring elements.

Several approaches can be used to transform the continuous physical formulation of the problem to its finite-element discrete analogue. For PDEs, the most popular method of their finite element formulation is that known as the Galerkin method as discussed in O. Axelsson and V. A. Barker. Finite Element Solution of Boundary Value Problems, Academic Press, Inc., London, 1984, the contents of which are hereby incorporated by reference.

In time-dependent problems, e.g. hyperbolic equations, areas of interest, i.e. areas with high gradient or with turning points or rapid changes, are propagated through the domain, that is they tend to move over time across the solution domain. Therefore, the mesh choice is preferably dynamic and follows the propagation of the areas of interest with time. For example, when the solution of hyperbolic problems involves a shock wave propagating through the mesh the location of the shock vicinity keeps changing in time. Thus, one wants to have the mesh more refined around the area of the shock vicinity and less refined elsewhere. Another example is the problem of fluid flow in a cavity, where flow cells are generated and undergo continuous changes in their shapes and size as time proceeds. Thus, the mesh adaptation itself is a crucial part of the efficient computation of the numerical method. In order to achieve an optimal mesh, that is one in which the solution error is low relative to the number of nodes in the mesh, the mesh choice needs to be dynamic and must vary with time.

Current systems use indicators such as gradients from the solution at a present stage to identify where the mesh should be modified, that is to say where it should be refined and where it can be made coarser, at the next time stage. However, such a system suffers from the obvious defect that it operates one step behind. In other words, if the areas of interest are propagated, then the current systems leave refining a step behind the most interesting phenomena.

There is thus a widely recognized need for, and it would be highly advantageous to have, a device and method for optimizing finite mesh based numerical solutions which is devoid of the above limitations.

SUMMARY OF THE INVENTION

According to one aspect of the present invention there is provided apparatus for calculating numerical solutions for partial differential equations in successive intervals using adaptive meshes, comprising:

a neural network part for producing predictions of values of a parameter at a following interval based on values of said parameter available from previous intervals, and a mesh adaptation part, associated with said neural network part, configured for adapting a mesh over a domain of a respective partial differential equation using said predictions, such that said mesh adaptively refines itself about emerging regions of complexity as said partial differential equation progresses over said successive intervals.

Preferably, the successive intervals are time intervals.

Preferably, the parameter is a gradient.

Preferably, said mesh adaptation part is further configured to adaptively coarsen said mesh about regions of low complexity.

Preferably, said mesh adaptation part comprises a first thresholder for thresholding gradients from said neural network parts, such that gradients above said threshold value are taken to indicate complexity and to lead to local refining of said mesh.

Preferably, said mesh adaptation part comprises a second thresholder for thresholding gradients from said neural network parts, such that gradients below said threshold value are taken to indicate complexity and to lead to local coarsening of said mesh.

Preferably, said neural network part comprises two neural networks, each having an input layer of input elements, at least one hidden layer of hidden elements and an output layer of at least one output element, said two neural networks differing from each other in respective numbers of input elements.

Preferably, each hidden element defines a hyperbolic tan-sigmoid transfer function.

Preferably, each output element defines a linear transfer function.

Preferably, a first of said neural networks is a boundary element neural network for calculating gradients of boundary elements of said adaptive mesh, and a second of said neural networks is an interior element neural network for calculating gradients of interior elements of said adaptive mesh.

Preferably, said boundary element neural network has fewer input elements than said interior element neural network.

Preferably, said input elements are connected to gather for a given mesh element a gradient of said mesh element, and a gradient of each neighboring element for each of a current and a previous interval.

Preferably, each hidden element defines a hyperbolic tan-sigmoid transfer function, each output element defines a linear transfer function, a first of said neural networks is a boundary element neural network for calculating gradients of boundary elements of said adaptive mesh, and a second of said neural networks is an interior element neural network for calculating gradients of interior elements of said adaptive mesh, and said boundary element neural network has fewer input elements than said interior element neural network.

Preferably, said interior element neural network comprises eight input elements, six hidden elements and one output element.

Preferably, said boundary element neural network comprises six input elements, six hidden elements and one output element.

Preferably, said neural network part is trainable by using initial random interval calculations of a respective partial differential equation.

Preferably, said neural network part is configured for training using the Levenberg Marquardt training method.

According to a second aspect of the present invention, there is provided a method of adapting a finite element mesh interactively with calculations of numerical solutions for a partial differential equation in successive intervals, said partial differential equation being calculated over a domain in accordance with respective finite elements of said mesh, each successive interval using a further adaptation of said mesh, the method comprising:

producing predictions of values of a parameter of said partial differential equation at mesh elements at a following interval based on values of said parameter available from said previous intervals, and adapting said mesh over said domain of a respective partial differential equation using said predictions, such that said mesh adaptively refines itself about emerging regions of complexity as said partial differential equation progresses over said successive intervals.

Preferably, said parameter is a gradient.

Unless otherwise defined, all technical and scientific terms used herein have the same meaning as commonly understood by one of ordinary skill in the art to which this invention belongs. The materials, methods, and examples provided herein are illustrative only and not intended to be limiting.

Implementation of the method and system of the present invention involves performing or completing selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIGS. 10–13 illustrate experimental results for the wave equation of FIG. 9 using a standard method, a neural network method using refining only and a neural network method using both refining and coarsening.

DESCRIPTION OF THE PREFERRED EMBODIMENTS

Figure 1:
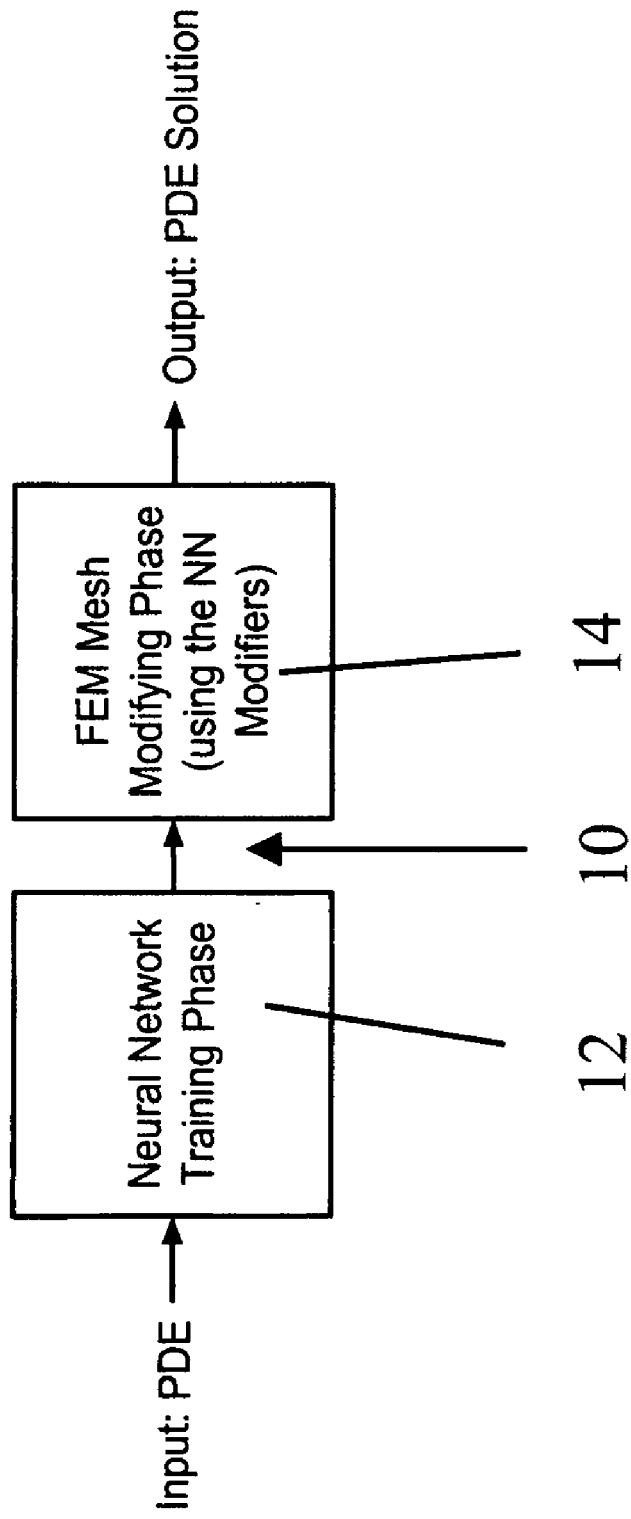
FIG. 1 is a simplified block diagram illustrating components of a calculation system according to a first embodiment of the present invention.

Basic learning algorithms and the neural network model are applied to the problem of mesh adaptation for the finite-element method for solving time-dependent partial differential equations. Time series prediction via the neural network methodology is used to predict areas of interest in order to obtain an effective mesh refinement at the appropriate times. The ability to concentrate resources effectively on such areas of interest allows for increased numerical accuracy with the same computational resources as compared with more traditional methods.

The present embodiments provide an improved approach to solving the mesh adaptation problem. The approach looks at mesh adaptation as a special instance of a control problem and uses the neural network to solve it in a similar way to that in which such networks have been used to predict time series.

The neural network is a universal approximator that learns from the past to predict future values. It receives, in some form, as input certain areas of interest of a present stage, and predicts areas of interest for the next stage. Using the predictor the present embodiments forecast the position of the action and refine the mesh accordingly.

The embodiments and supporting experiments described herein are for one and two-dimensional hyperbolic equations, that is to say wave equations, but are easily extendible to higher dimensional problems and other time-dependent PDEs.

The principles and operation of a forecasting system for areas of interest according to the present invention may be better understood with reference to the drawings and accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Reference is now made to FIG. 1, which is a simplified block diagram showing a general scheme for a preferred embodiment of the present invention. In FIG. 1, a numerical analysis device 10 for providing numerical solutions to partial differential equations and the like comprises a neural network learning unit 12 which solves the PDE, uses the solution to build up a set of training data and uses the training data to train the neural network. The result is one or more neural networks optimized to predict areas of interest. Connected to follow the learning unit is a finite element mesh adaptation unit 14 which receives the partial differential equation itself as an input and computes local results based on a mesh. The adaptation unit uses the neural networks produced in learning unit 12 to identify areas of interest based on predictions and to carry out local refining and/or coarsening of the mesh, based on the predictions, so as to concentrate resources in the most important areas of the solution. At each element position for each time stage a solution including a gradient is found numerically to the PDE and the gradient is fed back to the neural network which produces an indication as to whether to refine (or coarsen) the mesh at that point for the next stage. Thus the mesh progresses in time to follow changing areas of interest, being adapted in stages using modifiers provided by the learning unit 12. As will be explained in detail below, the modifiers are forecasts of areas of interest in the solutions.

Typically, learning is carried out using the same PDE as the adaptation. However, this may not always be possible or convenient. Learning may be carried out on one PDE and the resulting neural networks then used to apply predictions to a second PDE In addition, learning may be carried out one or more PDEs and the results applied to one or more other PDEs. Furthermore, if a solution is required for a given PDE over a time interval (0,T) then learning may be carried out over a first part of the interval $(0, t_1)$ and then use the predictions produced by the trained networks over the remainder of the interval $(t_1+dt, T)$.

It is noted that in learning unit 12, no mesh modification is carried out. However, it is possible to carry out learning whilst concomitantly modifying the mesh.

Before explaining the operation of FIG. 1 in greater detail, a brief survey is made of time series neural networks.

Background of Time Series Neural Networks

Feed-Forward Neural Networks

Neural networks (NNs) are a biologically inspired model, which tries to simulate the network of neurons, or the nervous systems, in the human brain. The artificial neural networks consist of simple calculation elements, called neurons, and weighted connections between them, A neural network can be trained to perform complex functions by adjusting the values of the connections (weights) between the elements (neurons) according to one of several algorithms. For the purposes of the present embodiments, the neural network may be considered simply as a data processing technique that maps, or relates, any kind of stream information to an output stream of data.

The most common NN model is the supervised-learning feed-forward network.

Figure 2:
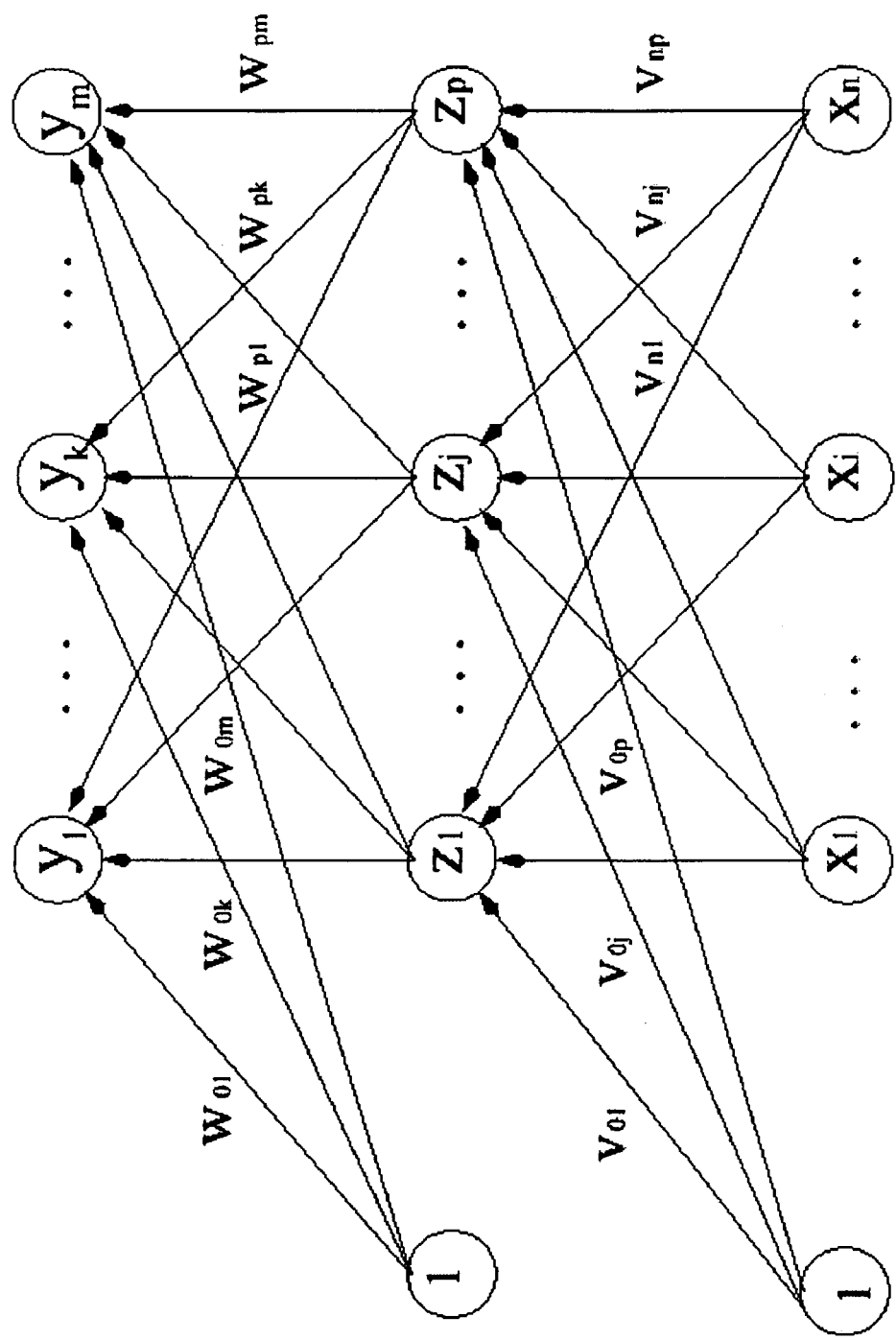
FIG. 2 is a simplified diagram illustrating a three layer neural network structure.

Reference is now made to FIG. 2, which is a simplified schematic diagram showing the configuration of a single hidden layer feed-forward network with n input units, p hidden units and m output units.

As shown in FIG. 2, the typical feed-forward network contains three types of processing units (neurons), input units, output units and hidden units, organized in a layered hierarchy as follows: an input layer, hidden layers and an output layer. The data from the input layer are multiplied by the weights associated with a next layer unit and summed together before processing by the unit in the next layer. Likewise the data from the hidden layer are summed together by weights associated with an output unit prior to processing by the output layer unit.

There are a number of training or learning algorithms. Of particular interest is the algorithm known as back-propagation. Back propagation consist of two phases: feed-forward propagation and backward propagation. In feed-forward propagation, the input units send the input signals forward through the network to produce an output. Then, the difference between the actual and desired outputs produces error signals which are sent backwards through the network to modify the weights between neurons. Modifying the weights between two connected layers is achieved by using a minimization procedure. The forward and backward propagation operations are executed iteratively over the training set until convergence occurs. Convergence is the state when the average squared error between the network outputs and the desired outputs reaches an acceptable value.

The mathematical expressions governing the neural network of FIG. 2 may be written as, where f is the activation function of the processing units;

$$z_j = f\left(v_{0j} + \sum_j x_i v_{ij}\right) \quad (1)$$

$$y_k = f\left(w_{0k} + \sum_k z_j w_{jk}\right) \quad (2)$$

$$E = 0.5 \sum_k (t_k - y_k)^2 \quad (3)$$

Training Algorithm

Back-propagation is the most popular training algorithm, and in back propagation the training data propagated through the network and the output data are calculated as in equations 1 and 2. The error between the expected output and the calculated output is computed as in equation 3. Then a minimization procedure is used to adjust the weights between two connection layers which proceed backwards from the output layer to the input layer. There are a number of variations of minimization procedures that are based on different optimization methods, and these include the gradient descent, Quasi-Newton and Levenberg-Marquardt methods. Each of these is now briefly considered.

Gradient Descent Method

The simplest implementation of back-propagation training uses a method in which the network weights are moved along the negative of the gradient of the error function. The gradient descent method is a first order learning algorithm, meaning that it only uses information about the first order derivative when it minimizes the error. The major drawback of the gradient descent method is that it requires a large number of steps before converging on a solution. One iteration of the gradient descent algorithm can be written as:

$$w_{jk}(\text{new}) = w_{jk}(\text{old}) - \alpha \frac{\partial E}{\partial w_{jk}} \quad (4)$$

$$v_{ij}(\text{new}) = v_{ij}(\text{old}) - \alpha \frac{\partial E}{\partial v_{ij}} \quad (5)$$

Where $\alpha$ is the learning rate. Let $W=\{v_{ij}, w_{jk}\}$ be the vector of all the connection weights in the network. Then we can write equation 4 and equation 5 as:

$$W_{l+1} = W_l - \alpha_l \nabla_{w_l} E \quad (6)$$

Quasi-Newton Method

The Quasi-Newton optimization method is a second order learning algorithm. The Quasi-Newton method provides an alternative and more efficient way of minimizing the sum of squares error E given in equation 3. The Quasi-Newton method is one of the fastest learning methods and provides a substantial improvement in the convergence rate over the gradient descent method. One iteration of quasi-Newton algorithm can be written as:

$$W_{l+1} = W_l - H^{-1} \nabla_{w_l} E \quad (7)$$

where $H^{-1}$ is the inverse of the Hessian matrix (second derivatives). The elements of the Hessian matrix take the form:

$$H_{ij} = \frac{\partial^2 E}{\partial w_i \partial w_j}, \quad \text{Where } w_i, w_j \in W. \quad (8)$$

The main drawback of the Quasi-Newton method is that it requires an expensive and complex computation in order to calculate the Hessian matrix in each iteration.

Levenberg-Marquardt Method

The Levenberg-Marquardt method combines the gradient descent methods with the Quasi-Newton method. One iteration of the Levenberg Marquardt algorithm can be written as:

$$W_{l+1} = W_l - (J^T J + \mu I)^{-1} \nabla_{w_l} E \quad (9)$$

Where J is the Jacobian matrix of error derivatives with respect to weights, $\mu$ is a scalar control parameter an I is the identity matrix. The computing of the Jacobian matrix is much less complex than computing the Hessian matrix; the Hessian matrix can be approximated as $H = J^T J$.

Time Series Neural Networks

Generally speaking, the prediction of a future gradient from a series of past values in a gradually changing PDE solution domain is very similar to solving time series. More particularly, time series is well suited for data where past values in the series may influence future values. In time series, a future value is a nonlinear function of the past m values:

$$x(n) = f(x(n-1), x(n-2), \ldots, x(n-m)) \quad (10)$$

Using a time series therefore means that it is necessary to fit a function x through its past values in order to extrapolate the function to the near future.

Now a feed-forward network can approximate any function after a suitable amount of training. Thus such a feed-forward network can be applied to the function fitting problem by submitting discrete values of the function to the network. The network is then expected to learn the function rule using the training algorithm. The behavior of the network is changed during the training algorithm by modifying the values of the weights.

Thus it is possible to use the back-propagation network as a nonlinear model that can be trained to map past and future values of a time series. Such a method, when used with neural networks, is called time series prediction and is used in the forecasting of financial markets for example to predict whether stock market rates will rise or fall.

Applying NNs to Time-Dependent PDEs

PDEs tend to describe a continuum in which some areas are subject to considerable change in gradient whereas large areas behave relatively smoothly. A successful numerical method therefore requires to identify as early as possible the areas of rapid change, hereinafter critical areas or areas of interest, so as to concentrate thereon. When using finite element mesh (FEM) based methods in order to solve PDEs numerically, critical regions are typically made subject to local mesh refinement. The critical regions are defined as those regions for which the local gradient shows larger changes. In order to accommodate the critical regions, the FEM adaptation process makes a local refinement in those areas, leaving the remaining mesh more coarse in the other areas. In time-dependent problems, the mesh refinement is preferably dynamic and depends on the error estimation at each time stage.

In the current art, most of the error estimate methods take into account a solution gradient. However, the present embodiments improve on the current art by being based on predicting the future gradient value of the solution. It is this predicted future value of the gradient which is used as the refinement criteria for the finite element mesh. In alternative embodiments of the invention, instead of the gradient, the second derivative is used. The second derivative is often a better prediction of the presence of complexity than the gradient. In further alternative embodiments the energy of the solution is used as a prediction of complexity. The energy is related to the gradient but is not identical thereto.

Figure 3:
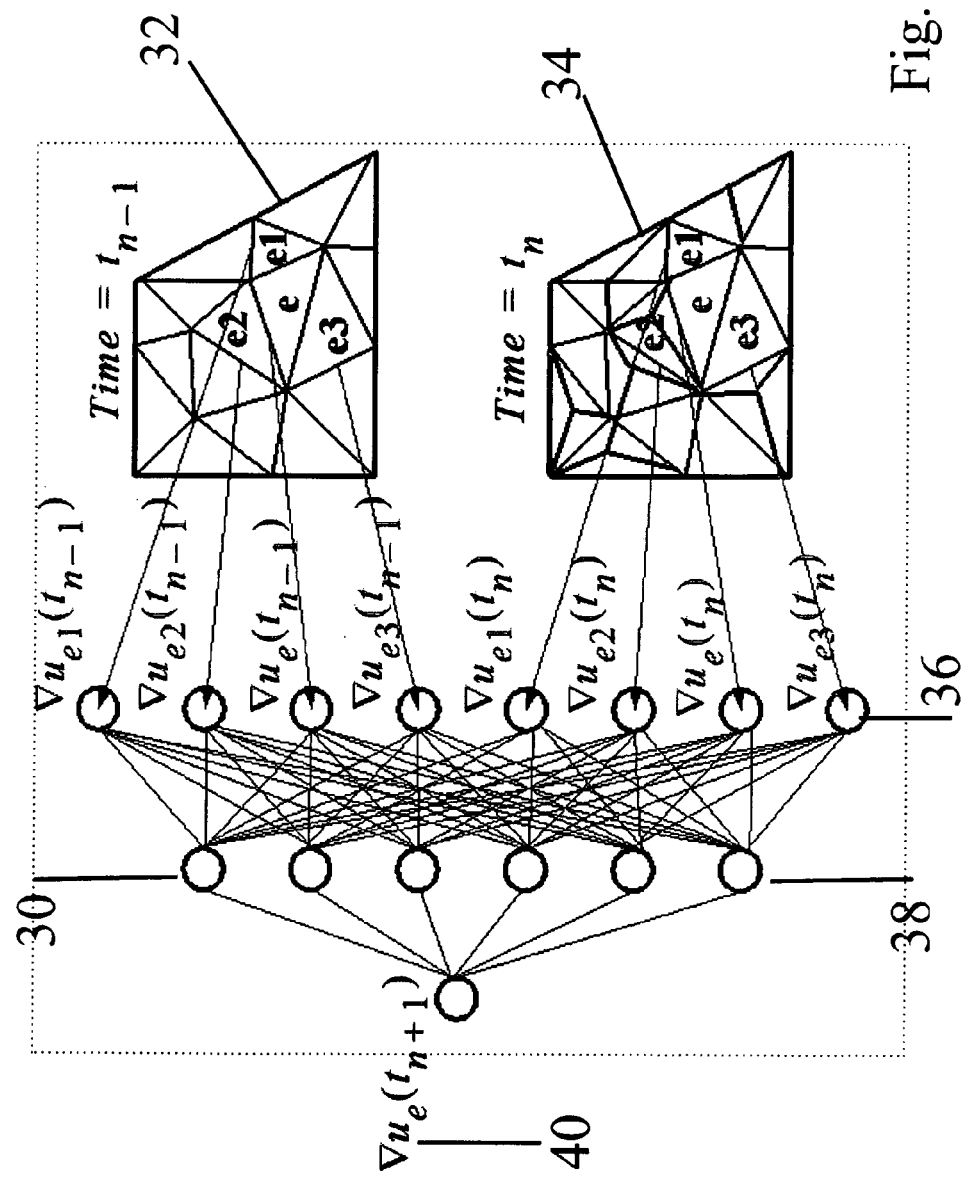
FIG. 3 is a simplified diagram showing in greater detail the calculation system of FIG. 1 during the course of two processing stages involving two respective adaptation stages of a finite element mesh.

In dynamic systems, e.g. hyperbolic equations, the areas of interest, i.e. the areas with high gradient, tend to propagated through the domain over the course of time. Therefore, for each mesh element the future gradient value is influenced by the past gradient values of the element and of its direct neighbors. In other words, the future gradient value can be considered as a nonlinear function of its past values. Predicting the future gradient from passed gradients in such circumstances is thus a true time series problem and thus time series neural networks are ideal tools for predicting the future gradient values. Reference is now made to FIG. 3 which illustrates the concept of using predictions of future gradient values computed using a time series technique to locate the critical regions for refinement of the mesh.

FIG. 3 shows a neural network 30 of the kind shown in FIG. 2, an upper mesh domain 32 and a lower mesh domain 34. The upper domain 32 represents the mesh at time $t_{n-1}$ and the lower domain 34 shows the mesh at time $t_n$. At time $t_n$ it is apparent that some elements are refined. The structure of a typical neural network 30 for the present purpose is now considered. The neural network 30 uses eight input units 36. The input elements take from the mesh the value of the gradient of the element and its two neighbors in the current 34 and previous 32 iterations. Hidden units 38 preferably use a hyperbolic tan-sigmoid transfer function. A single output unit 40 has a linear transfer function. The output of the output unit 40 is preferably the gradient prediction in the region of the given mesh element, and is used to generate a new version of the mesh, that is to say a mesh for $t_{n+1}$.

The neural network 30 receives as its input the gradient of element e and its neighbors e1; e2 and e3 at times $t_{n-1}$ and $t_n$, and as output it provides a predicted gradient value of element e at time $t_{n+1}$. The above assumes of course that the network is already trained, and in practice the network has to be trained on each individual PDE. Thus there are two steps in the methodology of the present embodiments as follows:

(a) training the neural network to predict the indicators, the indicators being the gradients, at least one step in advance, and (b) obtaining outputs and using them in the trained neural net to obtain indicators for refinement (and/or coarsening) of the mesh in the FEM solution.

Figure 4A:
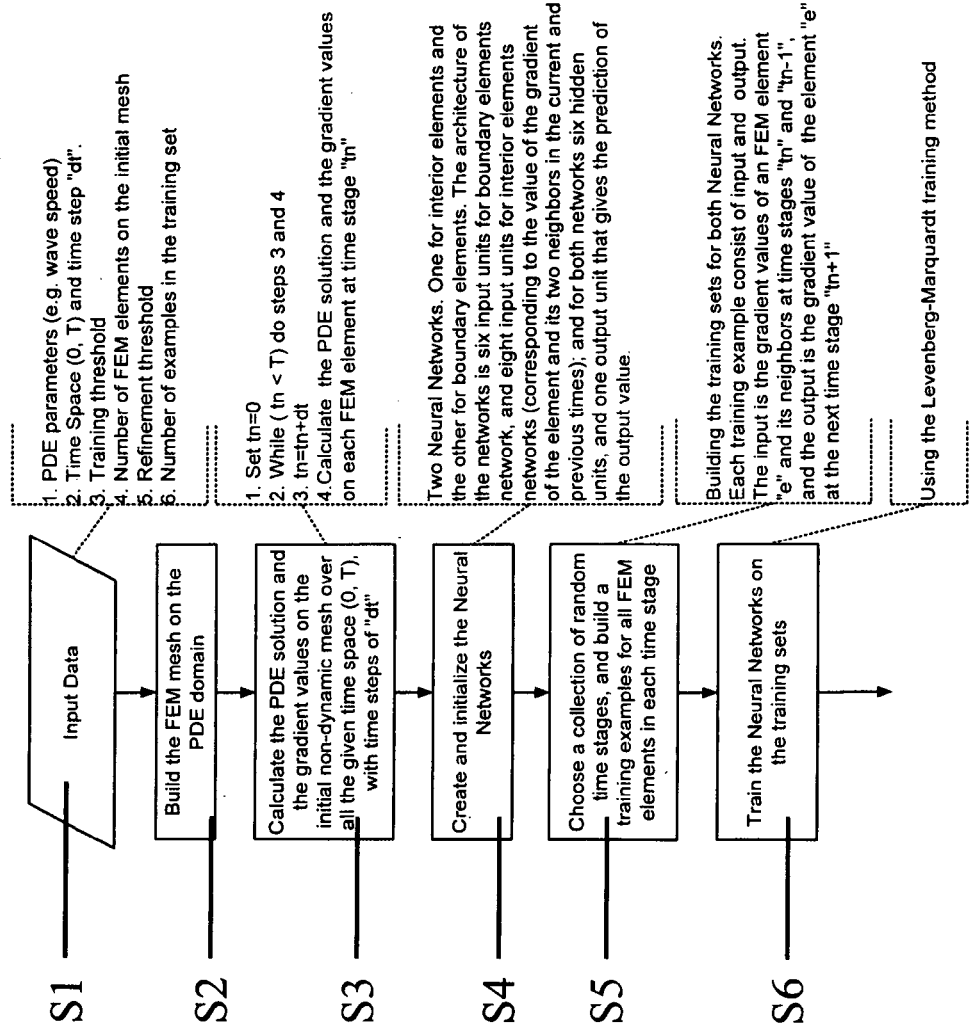
FIG. 4 is a simplified flow diagram showing the operation of a preferred embodiment of the present invention according to a preferred embodiment of the present invention.
Figure 4B:
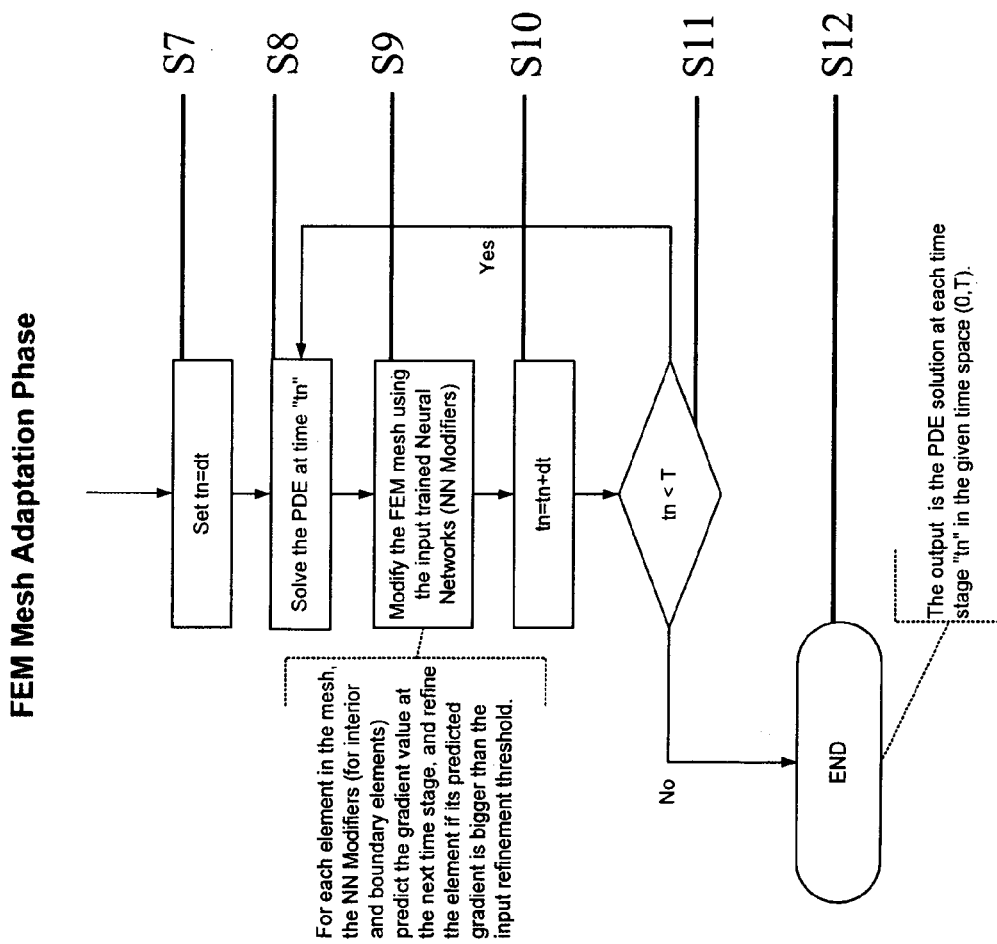

Reference is now made to FIG. 4, which is a simplified diagram illustrating the procedural flow for providing a numerical solution to partial differential equations according to a preferred embodiment of the present invention. In FIG. 4, the procedural flow is divided into two parts, a neural network (NN) training phase and a finite element mesh (FEM) adaptation phase. In a stage S1, input data is received which typically includes the following:

(i) PDE Parameters, such as wave speed, (ii) Time interval of interest (0, T) and time step, (dt), (iii) Training threshold, (iv) Number of FEM elements on the initial mesh, (v) Refinement threshold, and (vi) Number of examples in the training set.

An FEM mesh is then constructed in stage S2 over the domain of the PDE.

Stage S3 comprises calculating the solution to the PDE and corresponding gradients on the initial mesh, that is the mesh defined non-dynamically in stage S2. The calculations are made for all of the relevant time interval (0, T) at steps of dt.

In more detail S3 begins by setting a time variable $t_n$ to zero. Then for as long as $t_n$ is less than a maximum time T, $t_n$ is incremented by dt, and for each increment the PDE solution and gradient are calculated.

The next stage, S4, involves creating and initializing the neural networks. Two neural networks are constructed, one for interior elements and one for boundary elements. In a preferred embodiment, the neural network for interior elements comprises eight input units, six hidden units and one output unit. For boundary elements there are six input units, six hidden units and one output unit. The input units take gradient values of the mesh element and its neighbors from a current and a previous iteration. The hidden elements apply a hyperbolic tan-sigmoid transfer function and the output unit applies a linear transfer function to give the time series prediction as an overall output.

Stage S5 involves making a selection of random time stages over the time interval of interest and constructing a training set for the FEM elements at each stage. Constructing the training set is carried out for both of the neural networks constructed in S4, that is both for the interior element and the boundary element networks. Each training set comprises an input and an output, the input being the gradient values of a FEM element e and its neighbors at time stages $t_n$ and $t_{n-1}$. The output is the gradient of element e at $t_{n+1}$.

In stage S6, the neural networks are trained using the training sets. In a preferred embodiment, the networks are trained using the Levenberg-Marquardt training method.

The procedure then moves on to the Mesh adaptation phase with stage S7 in which the time variable $t_n$ is set to dt, that is to say the first step inside the interval of interest (0, T). In step S8, the PDE is solved for time $t_n$ to obtain gradient values over the current mesh. The results of step S8 are used as inputs to the neural networks and predictions are produced of the gradients for the next step. In step S9 the mesh is adapted using predictions from the neural network. The mesh is refined where the gradient is above a threshold and otherwise left alone in one embodiment. In another embodiment the mesh is also coarsened where the gradient is below a second threshold.

In stage S10 the time interval is moved forward by dt and a test stage S11 returns the procedure to S8 until the end of the time interval is met. The final output at S12 is the PDE solution at each step dt over the interval of interest. The mesh has been continually adapting over the solution to concentrate on areas of interest as they emerge over the time interval. Thus if a region of interest is in one corner early in the time interval, and then disappears, and a second region of interest appears later on in another corner, the procedure succeeds in concentrating resources on the first region early on and to transfer the resources rapidly to the second region as it emerges.

Additional objects, advantages, and novel features of the present invention will become apparent to one ordinarily skilled in the art upon examination of the following experiments and comparative examples, which are not intended to be limiting.

Experiments

Reference is now made to the following Experiments which, together with the above description, illustrate the invention in a non limiting fashion.

In the following experiments we examine the numerical results of applying this procedure using the FEM on different time-dependent PDE problems using different parameters for the NN algorithm and comparing this with (i) FEM with no adaptation and (ii) FEM using the "standard" adaptation via the current gradient indicator.

Measures of Solution Quality

To measure the quality of the FEM solution, we calculate both of the $L^2$ and $L^\infty$ error norm per value in each time stage. (Here u is the analytic solution and $u_h$ is the numerically computed solution).

$$L^2 \text{ error/value} = \frac{\sum_{nodes} |u(\text{node}) - u_h(\text{node})|^2}{\sum_{nodes} |u(\text{node})|^2}, \quad (11)$$

$$L^\infty \text{ error/value} = \frac{\max_{nodes} |u(\text{node}) - u_h(\text{node})|}{\max_{nodes} |u(\text{node})|}, \quad (12)$$

The $L^2$ error norm measures the error over the entire solution space, the average error, and the $L^\infty$ measures the maximum error occurring in the solution.

Use of an analytic solution is important in order to measure the precise error in the solution. When the analytic solution of a PDE is not available, we do one calculation with a very small time step and a very fine constant mesh, and then we use this solution as a reference to the analytic one. In all cases, we report at the end of each experiment the average of $L^2$ and $L^\infty$ error per value over all the time space.

Neural Network Architecture and Training

MATLAB's Neural Network Toolbox was used for designing and training the neural network; and the MATLAB's Partial Differential Equation Toolbox was used for defining, and solving the two dimensional PDEs problems. For one dimensional problems, we used a FEM solver which we developed especially for our research needs. In the examples tested so far the results are fairly dramatic. First, using the Levenberg-Marquardt training algorithm the training was both quite swift and exceptionally accurate.

Second, the improvement in the FEM numerical results, as compared with the standard gradient adaptive method, was as high as 25% in some examples; and never fell significantly below the standard method. The variance in the improvement depends on the shape of the wave; and is to be expected. The variance simply expresses the fact that for some waves it is more important to predict the gradient than others.

The experiments use two different networks, one for boundary elements and one for interior elements. It is noted that embodiments using a single network or more than two networks are also possible. In particular it may be desirable to use two networks for different interior elements. The architecture of the networks as used in the experiments uses six input units for boundary elements networks, and eight input units for interior element networks. The input elements thus correspond to the value of the gradient of the element and its two neighbors in the current and previous iterations. For both the networks, six hidden units are used, as opposed to the version shown in FIG. 3, where only three hidden units are used. The hidden units preferably use a hyperbolic tan-sigmoid transfer function. Both networks preferably use a single output unit having a linear transfer function. The output of the output unit is preferably the gradient prediction in the region of the given mesh element. The skilled person will appreciate that other numbers and combinations of input, hidden and output units are possible. Also the training algorithms and the active functions in the various neurons can be varied.

In order to make the training more efficient: (a) we normalize the input and output data between the values 0 and 1; and (b) we divide training data into two disjoint subsets: a training set and a testing set. The training set is used for computing the gradient and updating the network weights and biases. Testing on the validation set is monitored during the training process; as long as the error decreases, training continues. When the error begins to increase, the net begins to overfit the data and loses its ability to generalize; at this point the training is stopped. The skilled person will be aware that the above strategy may be varied.

To generate training data: (a) we calculate the solution on the initial non-dynamic mesh over all the given time space; (b) we select a collection of random time stages, and build training examples for all the elements in the time stages selected. The training data, consists of more than 800 examples (about 600 for training set and 200 for testing set).

One Dimensional Wave Equations

Mesh Refining

In experiments, the NN modifier was run over a variety of initial conditions for the one dimensional wave equation. In all cases, the NN predictor was extremely accurate.

Figure 5:
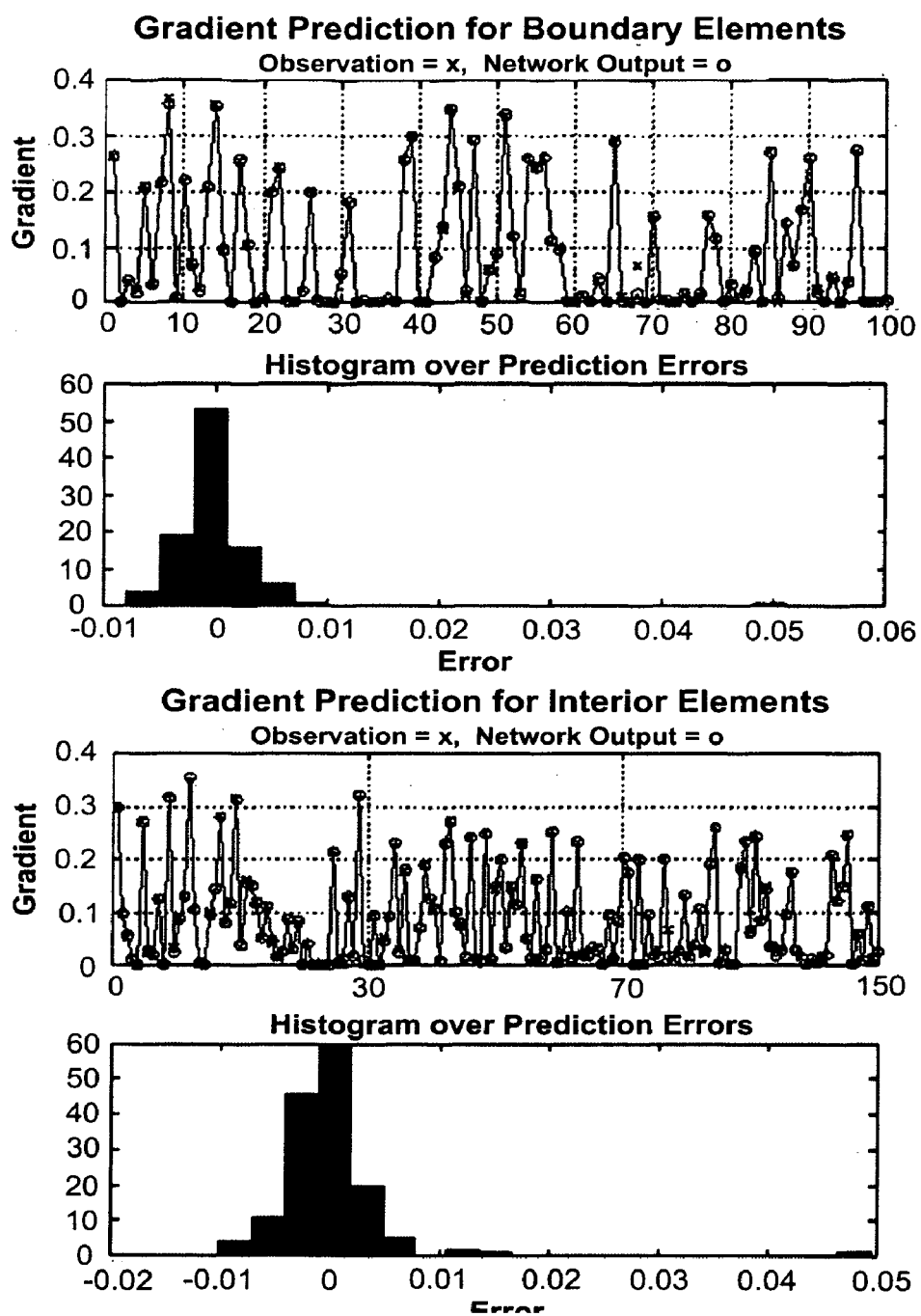
FIG. 5 is a graph illustrating the results of a typical prediction test for interior and boundary elements to test time series prediction for the ID Wave Equation.

Reference is now made to FIG. 5, which is a graph showing the results of a typical prediction test for interior -below- and boundary -above- elements to test time series prediction for the 1D Wave Equation. Training took about 117 time stages to converge to an extremely small error (about 0.00024) in the interior element prediction. In FIG. 4, for each of the boundary and interior cases (x) indicates test values; and (o) indicates the network response or prediction. The graph shows randomly selected test cases for various times.

Comparing the upper to the lower parts of FIG. 5 shows that results for the boundary elements were similar to those of the interior elements. When applying the modifier to the FEM mesh, the numerical improvement over the "standard" gradient modifier varied from no significant improvement to an improvement of more than 25%, with respect to both the $L^2$ error norm and the $L^\infty$ error norm.

Figure 6:
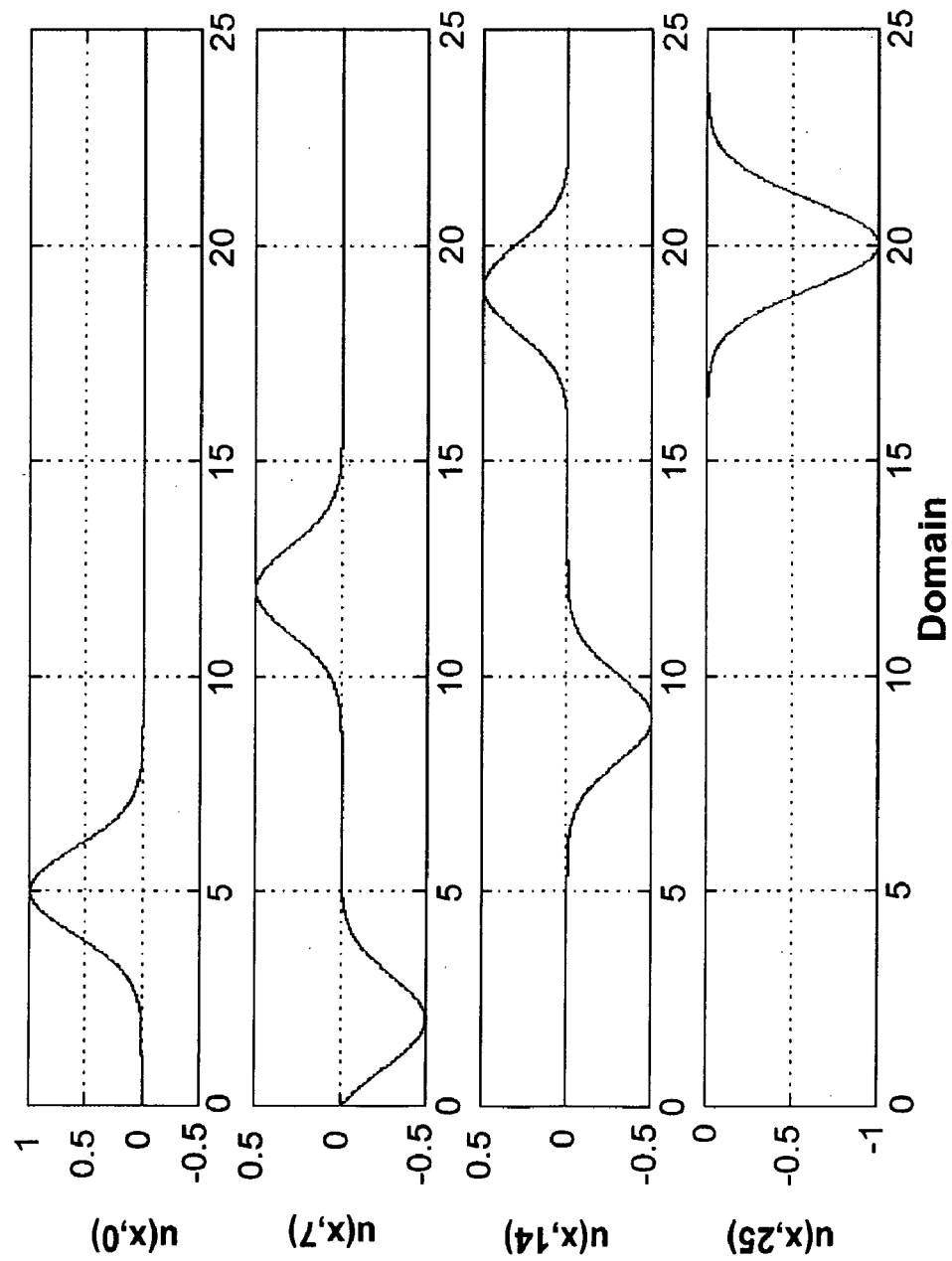
FIG. 6 illustrates the analytic solution for a 1D wave equation used in the example.
Figure 7:
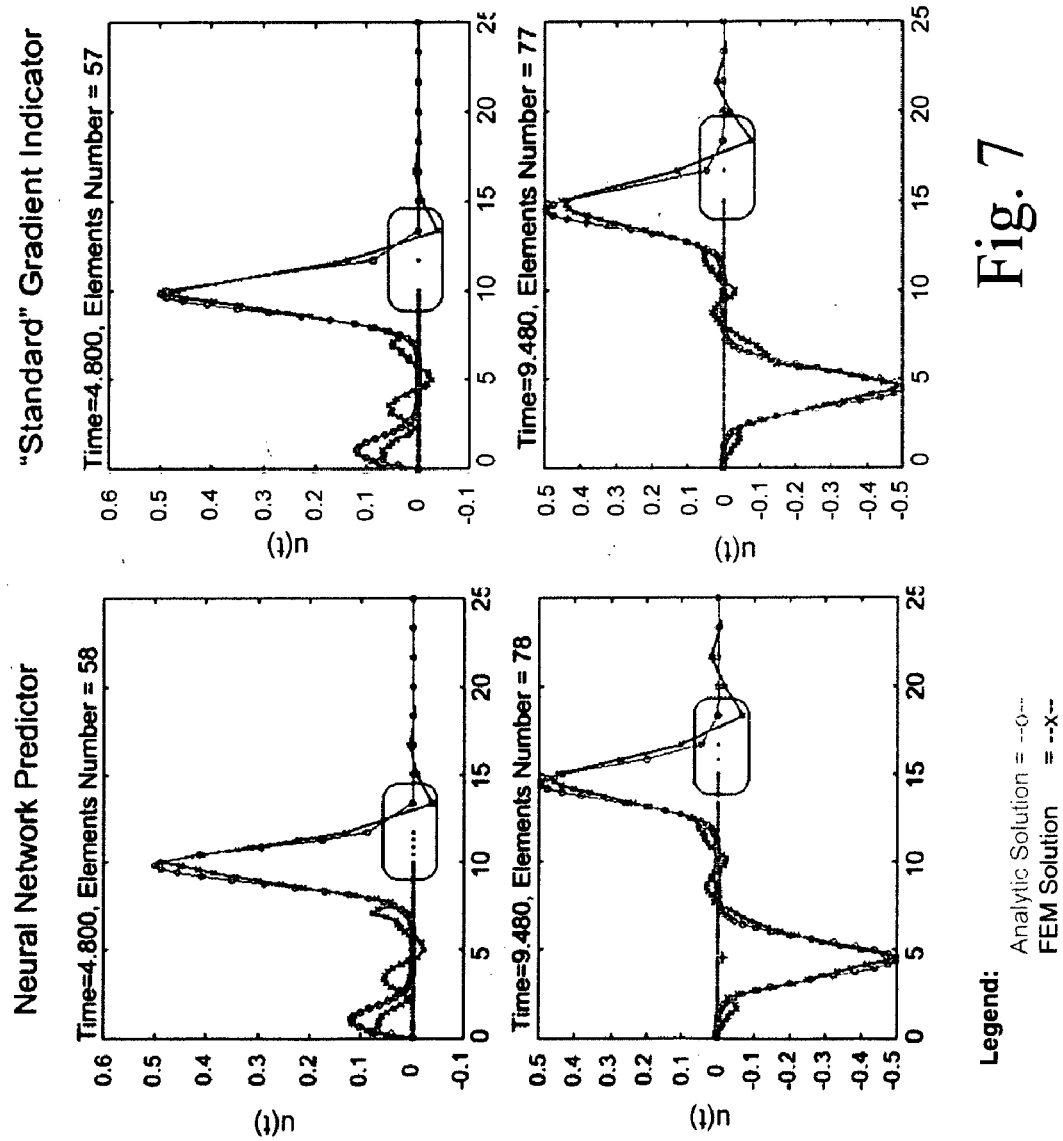
FIG. 7 is a comparative graph showing two successive stages of NN and standard mesh adaptation shown side by side.

In order to consider the various initial conditions used for the 1D wave equation, particular reference is now made to Example 2 in Table 1 below, in which the initial condition of the wave is a Gaussian. The analytical solution is well known for these types of problems, and reference is now made to FIG. 6, which illustrates such an analytic solution. The solution depends on the initial and boundary conditions. The wave splits into two waves, with the same width but half the height, that travels to the left and to the right with speed c=1. When such a traveling wave reaches the edge it turns over and returns upside down. Two successive stages of the NN modified solution and the "standard" gradient modifier are displayed side by side in FIG. 7 along a line indicating the analytic solution. Dots along the line in each case indicate the density of mesh elements. A particular area of interest involving a sharp turning point is indicated by a marker rectangle. Observing the areas indicated in the figure, one can see that the NN has chosen to place its resources in the correct places. Looking at the refinement markings, shown as dots on the x- axis, one can see that, as suggested, the NN keeps pace with the development of the solution, whereas the prior art method is always one-step behind. At critical locations the standard method thus suffers from increased numerical error.

Figure 8A:
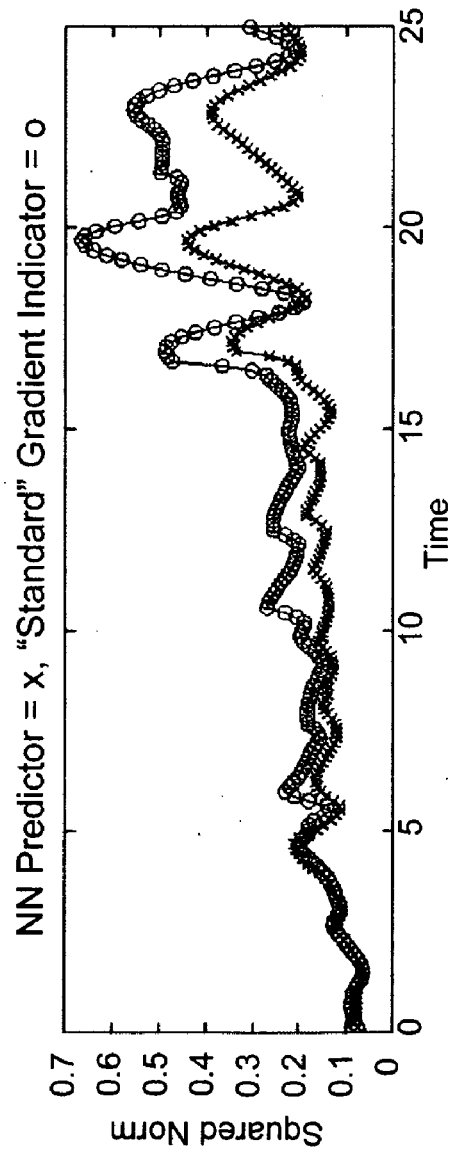
FIGS. 8A and 8B are graphs showing mean square and infinite error norms for each of the NN and standard adaptation techniques.
Figure 8B:
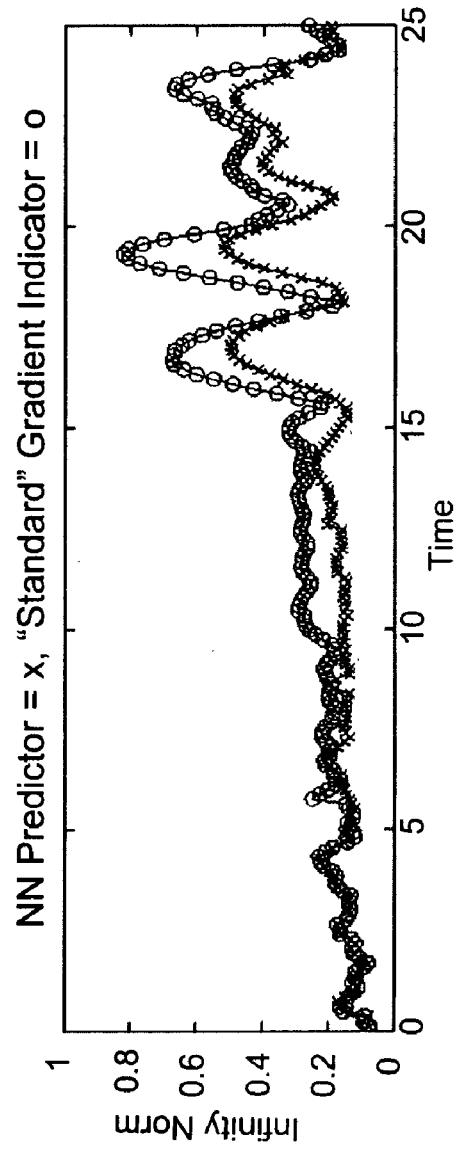

Since the one-dimensional examples have analytic solutions, it is possible to keep track of the actual numerical errors of each of the methods. Reference is now made to FIGS. 8A and 8B, which show tracking of the errors respectively using the $L^2$ error norm and the $L^\infty$ error norm. In FIGS. 8A and 8B, the neural net predictions are indicated by X and the standard method predictions by O.

The wave of the analytical solution reaches the edge at time t=15 (see FIG. 5 above) and it starts to turn over and returns upside down. Such a phenomenon is clearly shown in FIG. 8, in which the errors, both in the $L^2$ error norm and in the $L^\infty$ error norm, begin to rise at time t=15 and keep changing until the wave starts to return upside down (at t=25). During this critical time interval, the method of the present embodiments shows a distinct advantage over the standard method.

TABLE 1

One dimension example. Comparison between FEMs run with (i) The neural network predictor of the gradient measure. (ii) "Standard" refinements using the gradient measure. (iii) No adaptation.

Example 1

$$\frac{\partial^2 u}{\partial t^2} = \frac{\partial^2 u}{\partial x^2}, 0 \le x \le 10$$

$$u(0, t) = 0 \text{ and } u(10, t) = 0$$

$$\frac{\partial u}{\partial t}(x, 0) = 0 \text{ and } u(x, 0) = \begin{cases} 1 - |1 - x|, & 1 \le x \le 2 \\ 0, & \text{otherwise} \end{cases}$$

TABLE 1-continued

One dimension example. Comparison between FEMs run with (i) The neural network predictor of the gradient measure. (ii) "Standard" refinements using the gradient measure. (iii) No adaptation.

Number of Initial Elements: 10, Time: 12, Time Step: 0.08
Threshold for refinement = 0.08 (gradient)

| Method | Number of Refined Elements | $L^2$ Error Norm Max | $L^2$ Error Norm Average | $L^\infty$ Error Norm Max | $L^\infty$ Error Norm Average |
|---|---|---|---|---|---|
| NN Modifier | 70 | 0.15756 | 0.0869 | 0.1653 | 0.1056 |
| Standard Modifier | 70 | 0.1826 | 0.1022 | 0.1914 | 0.1222 |
| No Adaptation | 0 | 2.5332 | 1.0053 | 3.4708 | 1.0643 |

Improvement: $L^2$ error norm = 15%,
$L^\infty$ error norm = 13.6%

Example 2

$$\frac{\partial^2 u}{\partial t^2} = \frac{\partial^2 u}{\partial x^2}, 0 \leq x \leq 25$$

$$u(0, t) = 0 \text{ and } u(25, t) = 0$$

$$\frac{\partial u}{\partial t}(x, 0) = 0 \text{ and } u(x, 0) = \begin{cases} \exp\left(\frac{-(x-5)^2}{2}\right), & 1 \leq x \leq 10 \\ 0, & \text{otherwise} \end{cases}$$

Number of Initial Elements: 15, Time: 25, Time Step: 0.12
Threshold for refinement = 0.2 (gradient)

| Method | Number of Refined Elements | $L^2$ Error Norm Max | $L^2$ Error Norm Average | $L^\infty$ Error Norm Max | $L^\infty$ Error Norm Average |
|---|---|---|---|---|---|
| NN Modifier | 98 | 0.4423 | 0.1928 | 0.5190 | 0.2342 |
| Standard Modifier | 91 | 0.6671 | 0.2686 | 0.8230 | 0.3142 |
| No Adaptation | 0 | 1.4622 | 0.6985 | 1.6288 | 0.6456 |

Improvement: $L^2$ error norm = 28%, $L^\infty$ error norm = 25%

Mesh Coarsening

The NN predictions provide modifiers which can be used both for refining and coarsening the FEM mesh at the same time. Thus, when the gradient of an element is bigger than a given refinement threshold the system decides to refine the mesh, and when it is less than a given coarseness threshold the system decides to coarsen the mesh. In the following, we present two examples both using the same wave equation. The examples used are Example 3 and Example 4 in Table 2 below. In Example 3, we use the NN modifiers only for refining the FEM mesh and in Example 4 we the NN modifiers both for refining and coarsening the FEM mesh at the same time.

Figure 9:
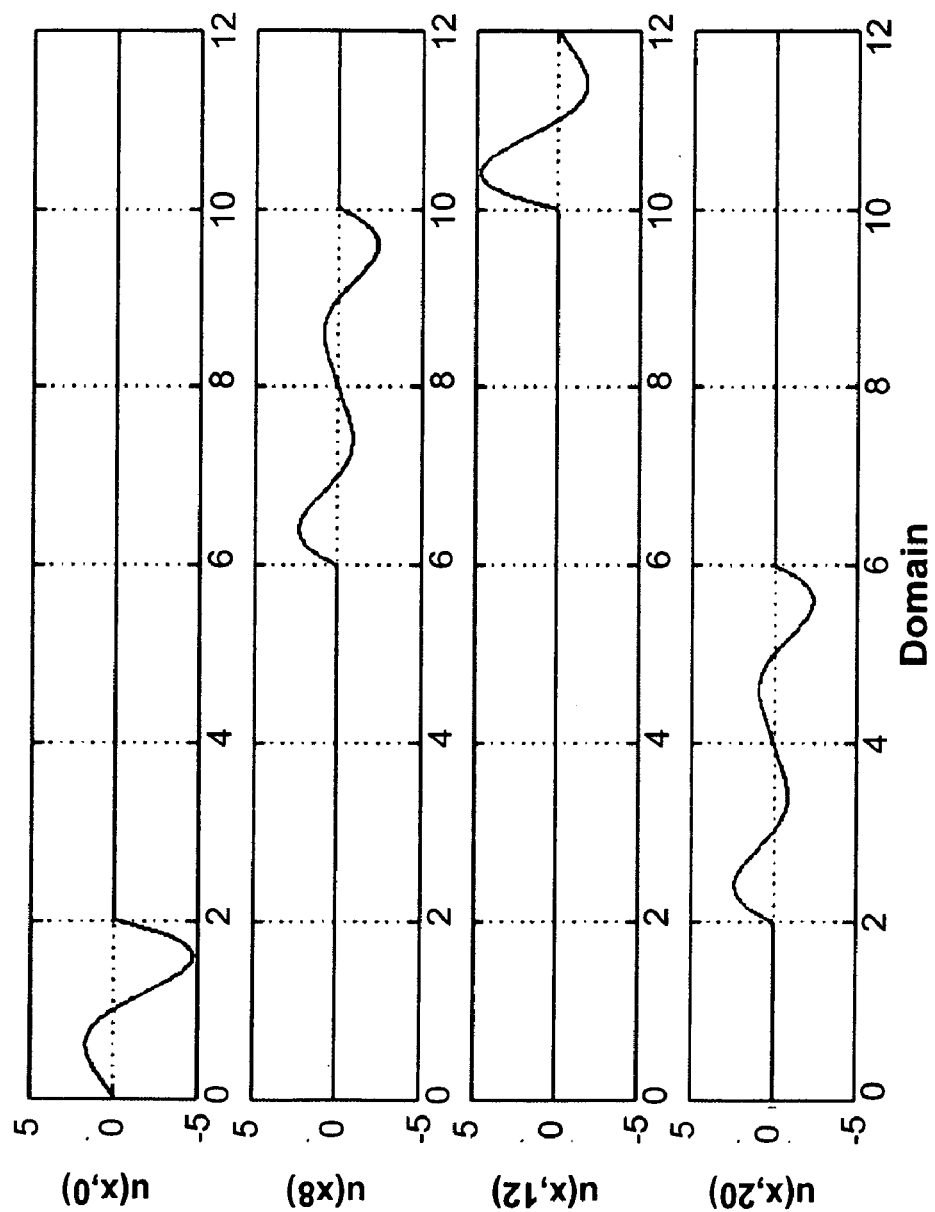
FIG. 9 is a graph illustrating the analytic solution for another wave equation used in an example.
Figure 10A:
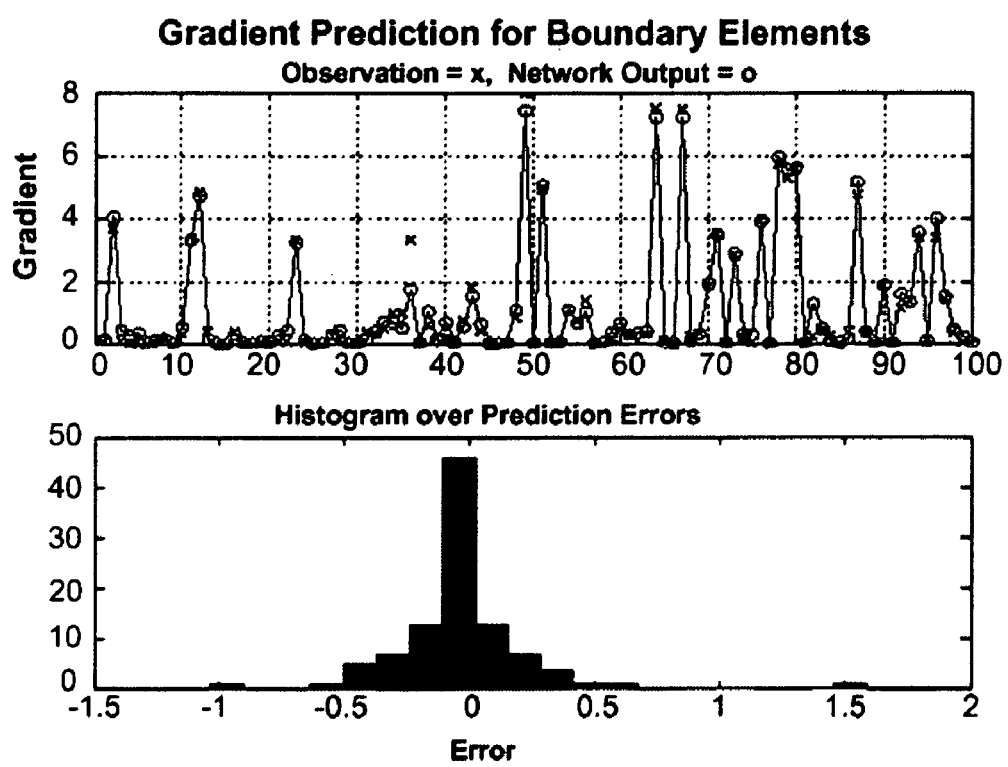
Figure 10B:
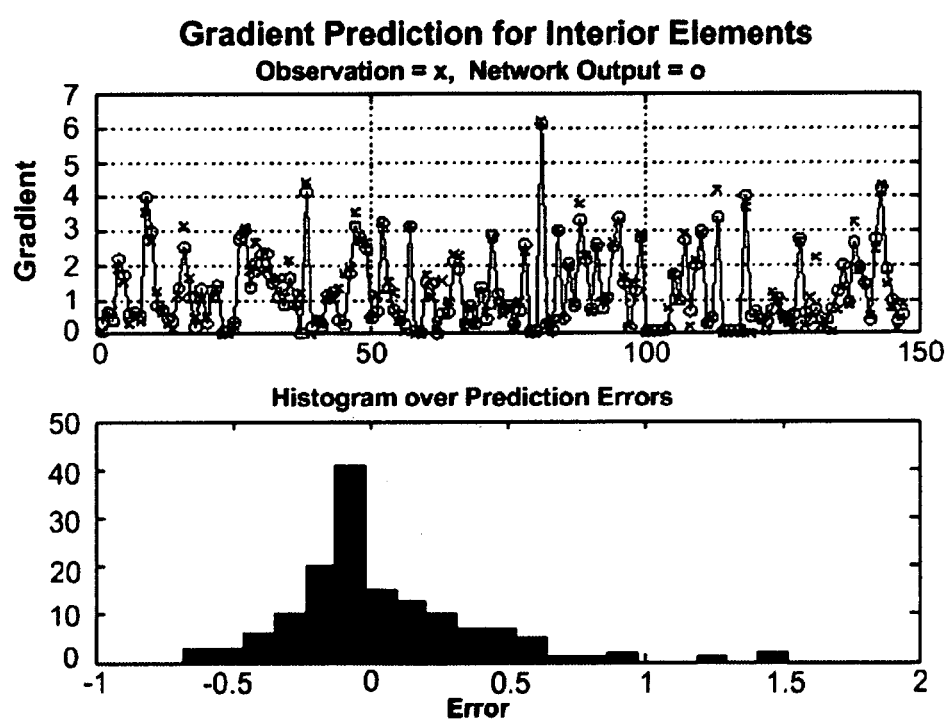

The results are shown in FIGS. 9–13 to which reference is now made. FIG. 9 presents the analytic solution of the given wave equation, FIGS. 10A and 10B present the prediction graph of the NN modifier, in which FIG. 10A shows gradient prediction for boundary elements and FIG. 10b shows the same for interior elements. The figure illustrates time series prediction tests for Example 3 and Example 4 respectively. Each prediction on the graph shows the network prediction (o) and the observed actual result (x) for randomly selected test cases for various times.

Figure 11:
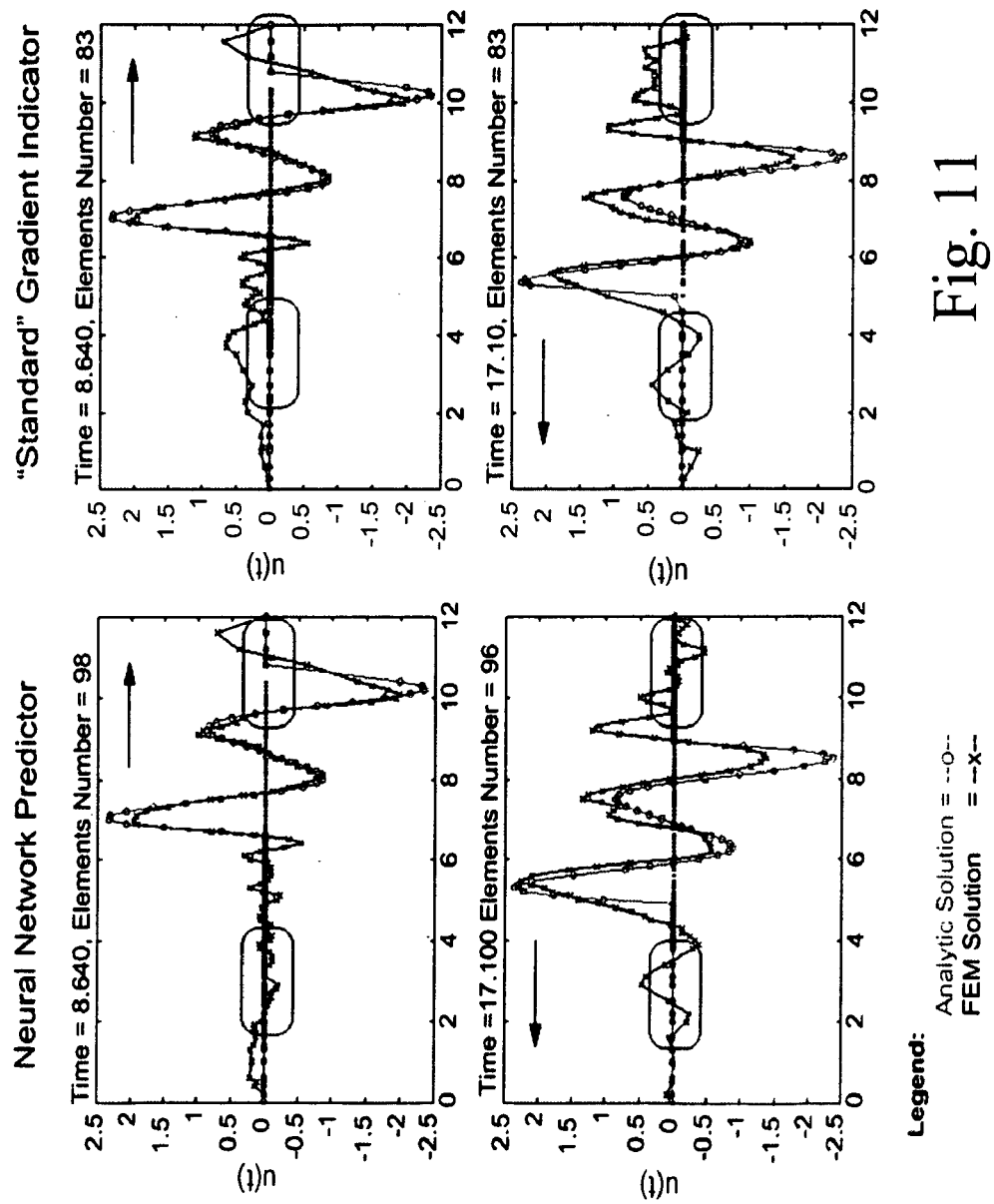

FIG. 11 shows two successive stages of the mesh development for the neural network and standard methods respectively for Example 4. That is to say the left hand side shows FEM mesh modification involving both refining and coarsening in accordance with the NN modifiers. Also indicated is the analytic solution. The right hand side shows results modified with the standard gradient indicator. A comparison of the critical segments of the curves on the left, the enclosed rectangles with the corresponding segments on the right clearly indicates how the NN predictor is successful at focusing the resources earlier on in the correct places.

FIGS. 12A and 12B present the square and infinite error norms respectively for Example 3 against the standard method and finally FIGS. 13A and 13B show the same for Example 4.

In both examples the results show that the NN modifier results are more effective than the standard gradient modifier. In Example 3, an improvement of 8.7% in the $L^2$ error norm and 5.4% in the $L^\infty$ error norm are achieved (see Table 2). The same improvement is apparent by comparing the error norm graphs in FIGS. 12A and 12B.

Comparing the left hand, NN enhancement, and right hand, standard method, graphs in FIG. 11, it is apparent that the NN modifier has placed the resources in the correct places and this explains the enhancement in the results.

A comparison between FIGS. 12 and 13 illustrates the benefit of using the NN modifier for coarsening as well as for refining. When using the NN modifier to coarsen the mesh, as in Example 4, the improvement rises from 8.7% as measured by the $L^2$ error norm to 9.1% and from 5.4% to 8.4% when measured by the $L^\infty$ error norm (see Table 2 and FIG. 13).

TABLE 2

FEM mesh refining and coarsening examples.

Example 3

$$\frac{\partial^2 u}{\partial t^2} = \frac{\partial^2 u}{\partial x^2}, 0 \leq x \leq 12$$

$$u(0, t) = 0 \text{ and } u(12, t) = 0$$

$$\frac{\partial u}{\partial t}(x, 0) = 0 \text{ and } u(x, 0) = \begin{cases} \exp(x)\sin(\pi x), & 1 \leq x \leq 2 \\ 0, & \text{otherwise} \end{cases}$$

Number of Initial Elements: 30, Time: 20, Time Step: 0.09
Threshold for refinement = 2 (gradient)

| Method | Number of Refined Elements | $L^2$ Error Norm Max | $L^2$ Error Norm Average | $L^\infty$ Error Norm Max | $L^\infty$ Error Norm Average |
|---|---|---|---|---|---|
| NN Modifier | 90 | 0.4146 | 0.2678 | 0.5097 | 0.3028 |
| Standard Modifier | 90 | 0.4468 | 0.2935 | 0.5891 | 0.3201 |

Improvement: $L^2$ error norm = 8.7%,
$L^\infty$ error norm = 5.4%

Example 4

$$\frac{\partial^2 u}{\partial t^2} = \frac{\partial^2 u}{\partial x^2}, 0 \leq x \leq 12$$

$$u(0, t) = 0 \text{ and } u(12, t) = 0$$

$$\frac{\partial u}{\partial t}(x, 0) = 0 \text{ and } u(x, 0) = \begin{cases} \exp(x)\sin(\pi x), & 1 \leq x \leq 2 \\ 0, & \text{otherwise} \end{cases}$$

Number of Initial Elements: 30, Time: 20, Time Step: 0.09
Threshold for refinement = 2 (gradient),
Threshold for coarseness = 0.3

| Method | Number of Refined Elements | $L^2$ Error Norm Max | $L^2$ Error Norm Average | $L^\infty$ Error Norm Max | $L^\infty$ Error Norm Average |
|---|---|---|---|---|---|
| NN Modifier | 90 | 0.7155 | 0.3710 | 0.5949 | 0.3478 |
| Standard Modifier | 73 | 0.7061 | 0.4085 | 0.7330 | 0.3799 |

Improvement: $L^2$ error norm = 9.1%, $L^\infty$ error norm = 8.4%

Two Dimensional Wave Equations

Figure 14:
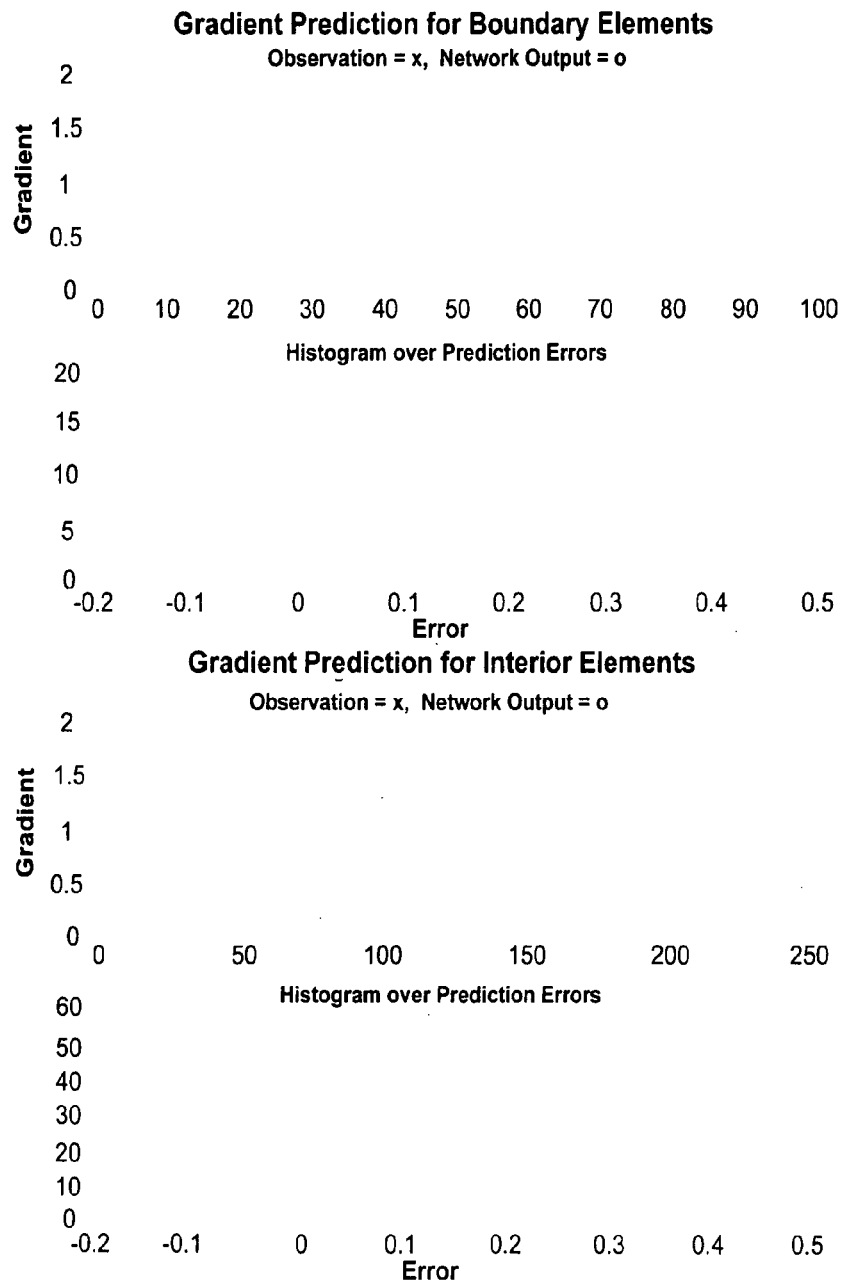
FIGS. 14–16 illustrate results achieved using a two-dimensional wave equation.
Figure 15:
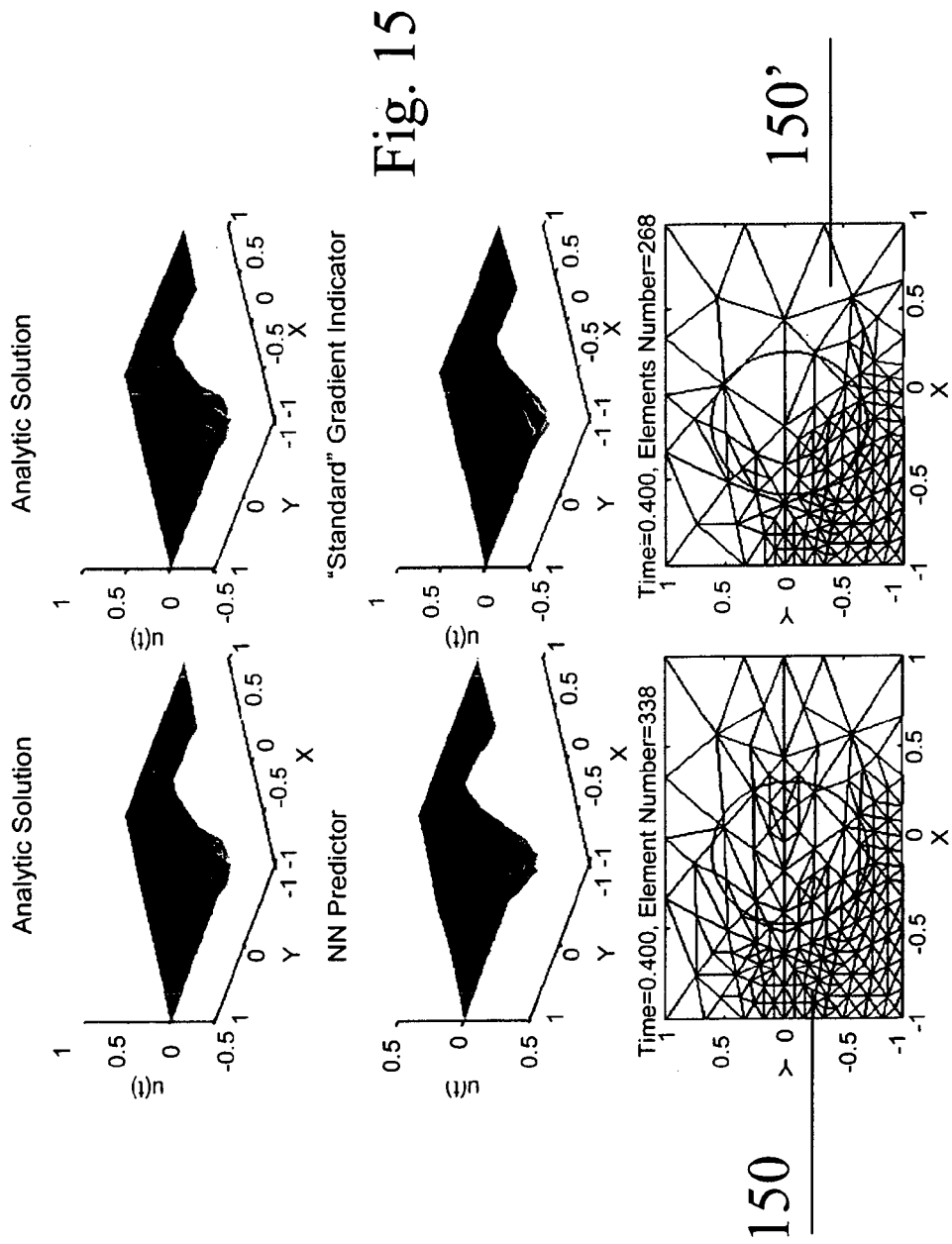

In a further set of experiments, the method was applied to a variety of two-dimensional wave equations. In all cases, the NN modifier showed a clear improvement although there was considerable variance in the extent of the improvement. Over the set of experiments carried out, as a whole the rate of improvement varied between around 2% and around 20%. The variance in the improvement depends on the initial conditions, for example the shape of the wave and its velocity. In the following we present just two examples, and the details are given in Table 3. The results are shown in FIGS. 14–16, to which reference is now made. FIG. 14 shows a time series prediction test for the 2D wave equation. In the graph, (x) indicates test values; and (o) indicates network response. Each prediction on the graph shows the network prediction against the observed actual result for randomly selected test cases at various times.

FIG. 15 shows FEM results using the two-dimensional wave equation and Example 1 of Table 3 below. The left hand side illustrates refinement with the NN predictor. The right figures are refined using the standard gradient indicator.

Figure 16A:
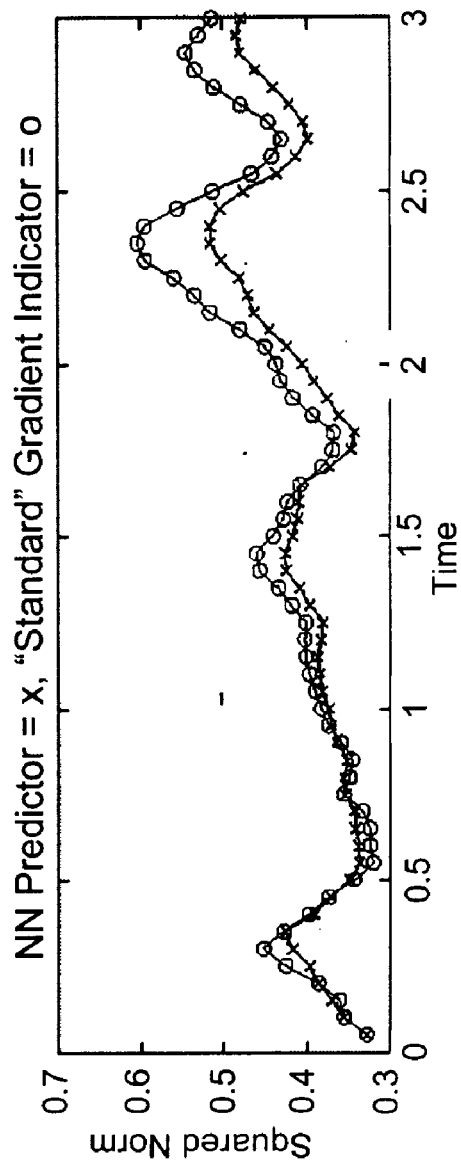
Figure 16B:
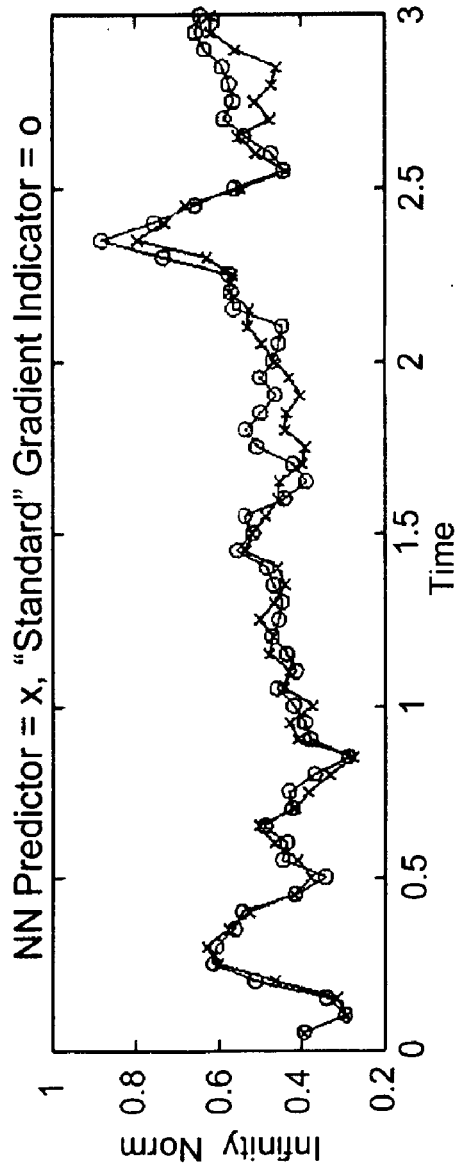

FIGS. 16A and 16B show square and infinite error norms respectively for Example 1 using the 2D wave equation. NN results are indicated by x, and standard results are indicated by o.

From the results it is apparent that:
1. the prediction of the gradient was very accurate, (see FIG. 14, and FIG. 15); and
2. the improvement in the FEM numerical results was around 10% over the standard gradient methods (see Table 3 and FIG. 16); From FIG. 15 it is clear the the NN method has chosen to place its resources in the correct places. Looking at the critical regions, indicated by circles 150, 150', it is apparent that the standard method trails behind the NN method.

TABLE 3

Two dimension examples. Comparison between FEMs run with (i) The neural network predictor of the gradient measure. (ii) "Standard" refinements using the gradient measure.

Example 1

$$\frac{\partial^2 u}{\partial t^2} = \frac{\partial^2 u}{\partial x^2} + \frac{\partial^2 u}{\partial y^2}, -1 \leq x \leq 1, -1 \leq y \leq 1$$

$u(-1, y, t) = 0$ and $u(1, y, t) = 0$ for $-1 \leq y \leq 1$ $u(x, -1, t) = 0$ and $u(x-1, t) = 0$ for $-1 \leq x \leq 1$ $$\frac{\partial u}{\partial t}(x, y, 0) = 0 \text{ and}$$

$$u(x, y, 0) = \begin{cases} 15x(x+1)y(y+1), & -1 \leq x \leq 0, -1 \leq y \leq 0 \\ 0, & \text{otherwise} \end{cases}$$

Number of Initial Elements: 28, Time: 3, Time Step: 0.05
Threshold for refinement = 1 (gradient)

| Method | Number of Refined Elements | Average $L^2$ Error | Average $L^\infty$ Error |
|---|---|---|---|
| NN Modifier | 803 | 0.4057 | 0.4846 |
| Standard Modifier | 803 | 0.4314 | 0.5029 |

Improvement: $L^2$ error norm = 6%, $L^\infty$ error norm = 3.6%

Example 2

$$\frac{\partial^2 u}{\partial t^2} = \frac{\partial^2 u}{\partial x^2} + \frac{\partial^2 u}{\partial y^2}, -1 \leq x \leq 1, -1 \leq y \leq 1$$

$u(-1, y, t) = 0$ and $u(1, y, t) = 0$ for $-1 \leq y \leq 1$ $u(x, -1, t) = 0$ and $u(x-1, t) = 0$ for $-1 \leq x \leq 1$ $$\frac{\partial u}{\partial t}(x, y, 0) = 3\sin(\pi x)\exp\left(\sin\left(\frac{\pi}{2y}\right)\right) \text{ and } u(x, y, 0) = \arctan\left(\cos\left(\frac{x}{2t}\right)\right)$$

TABLE 3-continued

Two dimension examples. Comparison between FEMs run with (i) The neural network predictor of the gradient measure. (ii) "Standard" refinements using the gradient measure.

Number of Initial Elements: 28, Time: 3, Time Step: 0.08
Threshold for refinement = 2.2 (gradient)

| Method | Number of Refined Elements | Average $L^2$ Error | Average $L^\infty$ Error |
|---|---|---|---|
| NN Modifier | 246 | 0.2962 | 0.3359 |
| Standard Modifier | 232 | 0.3256 | 0.3807 |

Improvement: $L^2$ error norm = 9%, $L^\infty$ error norm = 11%

Summary

We have implemented a version of a NN modifier for the FEM mesh; designed to adaptively change the mesh based on a prediction of the gradient. In experimental work, we have shown that the NN modifier method can accurately predict the gradient, and applying modification in this way results in a substantial numerical improvement.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. Apparatus for calculating numerical solutions for partial differential equations in successive intervals using adaptive dynamic meshes, comprising:
   at least one neural network part for producing predictions of values of a parameter at a following interval based on values of said parameter available from previous intervals, and
   a mesh adaptation part, associated with said at least one neural network part, configured for adapting a dynamic mesh over a domain of a respective partial differential equation using said predictions, such that said dynamic mesh adaptively refines itself about emerging regions of complexity as said partial differential equation progresses over said successive intervals.

2. Apparatus according to claim 1, wherein said successive intervals are time intervals.

3. Apparatus according to claim 1, wherein said parameter is a gradient.

4. Apparatus according to claim 1, wherein said dynamic mesh adaptation part is further configured to adaptively coarsen said dynamic mesh about regions of low complexity.

5. Apparatus according to claim 1, wherein said dynamic mesh adaptation part comprises a first thresholder for thresholding gradients from said at least one neural network parts, such that gradients above said threshold value are taken to indicate complexity and to lead to local refining of said dynamic mesh.

6. Apparatus according to claim 4, wherein said dynamic mesh adaptation part comprises a second thresholder for thresholding gradients from said at least one neural network parts, such that gradients below said threshold value are taken to indicate complexity and to lead to local coarsening of said dynamic mesh.

7. Apparatus according to claim 1, wherein said at least one neural network part comprises two neural networks, each having an input layer of input elements, at least one hidden layer of hidden elements and an output layer of at least one output element, said two neural networks differing from each other in respective numbers of input elements.

8. Apparatus according to claim 7, wherein each hidden element defines a hyperbolic tan-sigmoid transfer function.

9. Apparatus according to claim 7, wherein each output element defines a linear transfer function.

10. Apparatus according to claim 7, wherein a first of said neural networks is a boundary element neural network for calculating gradients of boundary elements of said adaptive dynamic mesh, and a second of said neural networks is an interior element neural network for calculating gradients of interior elements of said adaptive dynamic mesh.

11. Apparatus according to claim 10, wherein said boundary element neural network has fewer input elements than said interior element neural network.

12. Apparatus according to claim 7, wherein said input elements are connected to gather for a given mesh element a gradient of said mesh element, and a gradient of each neighboring element for each of a current and a previous interval.

13. Apparatus according to claim 12, wherein each hidden element defines a hyperbolic tan-sigmoid transfer function, each output element defines a linear transfer function, a first of said neural networks is a boundary element neural network for calculating gradients of boundary elements of said adaptive dynamic mesh, and a second of said neural networks is an interior element neural network for calculating gradients of interior elements of said adaptive dynamic mesh, and said boundary element neural network has fewer input elements than said interior element neural network.

14. Apparatus according to claim 13, wherein said interior element neural network comprises eight input elements, six hidden elements and one output element.

15. Apparatus according to claim 13, wherein said boundary element neural network comprises six input elements, six hidden elements and one output elemont.

16. Apparatus according to claim 1, wherein said at least one neural network part is trainable by using initial random interval calculations of a respective partial differential equation.

17. Apparatus according to claim 16, wherein said at least one neural network part is configured for training using the Levenberg Margurdt training method.

18. Method of adapting a finite element of a dynamic mesh interactively with calculations of numerical solutions for a partial differential equation in successive intervals, said partial differential equation being calculated over a domain in accordance with respective finite elements of said dynamic mesh, each successive interval using a further adaptation of said dynamic mesh, the method comprising:
producing predictions of values of a parameter of said partial differential equation at mesh elements at a following interval based an values of said parameter available from previous intervals, and
adapting said dynamic mesh over said domain of a respective partial differential equation using said predictions, such that said dynamic mesh adaptively refines itself about emerging regions of complexity as said partial differential equation progresses over said successive intervals.

19. The method of claim 18, wherein said parameter is a gradient.

* * * * *